(12) United States Patent
Lee et al.

(10) Patent No.: US 10,324,629 B2
(45) Date of Patent: Jun. 18, 2019

(54) NON-VOLATILE MEMORY DEVICE HAVING PAGE BUFFERS WITH DIFFERING CHARACTERISTICS

(71) Applicant: SAMSUNG ELECTRONICS CO., LTD., Suwon-si, Gyeonggi-Do (KR)

(72) Inventors: Jong-Hoon Lee, Hwaseong-si (KR); Eun-Suk Cho, Suwon-si (KR); Woo-Pyo Jeong, Seoul (KR); Sang-Wan Nam, Hwaseong-si (KR); Jung-Ho Song, Anyang-si (KR); Yun-Ho Hong, Hwaseong-si (KR); Jae-Hoon Lee, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/869,769

(22) Filed: Jan. 12, 2018

(65) Prior Publication Data
US 2018/0292989 A1 Oct. 11, 2018

(30) Foreign Application Priority Data
Apr. 11, 2017 (KR) ........................ 10-2017-0046937

(51) Int. Cl.
*G11C 7/06* (2006.01)
*G06F 3/06* (2006.01)
(Continued)

(52) U.S. Cl.
CPC ............ *G06F 3/061* (2013.01); *G06F 3/0659* (2013.01); *G06F 3/0688* (2013.01); *G11C 7/106* (2013.01); *G11C 16/0483* (2013.01); *G11C 16/26* (2013.01); *G11C 16/32* (2013.01); *H01L 21/265* (2013.01); *H01L 27/0207* (2013.01); *H01L 27/11573* (2013.01); *H01L 27/11582* (2013.01)

(58) Field of Classification Search
CPC ...... G06F 3/061; G06F 3/0659; G06F 3/0688; H01L 21/265; H01L 27/0207; H01L 27/11573; H01L 27/11582
USPC .................................................... 365/189.05
See application file for complete search history.

(56) References Cited

U.S. PATENT DOCUMENTS 7,379,333 B2 * 5/2008 Lee .................... G11C 16/0483
365/185.12
7,450,433 B2 11/2008 Wan et al.
(Continued)

FOREIGN PATENT DOCUMENTS

| KR | 1020100055116 | 5/2010 |
|---|---|---|
| KR | 1020140025164 A | 3/2014 |
| KR | 1020150129940 A | 11/2015 |

*Primary Examiner* — Xiaochun L Chen
(74) *Attorney, Agent, or Firm* — Volentine, Whitt & Francos, PLLC

(57) ABSTRACT

A non-volatile memory device includes a memory cell array region in which memory cells are vertically stacked on a substrate and a page buffer region in which first and second page buffers are arranged. A first distance between the memory cell array region and the first page buffer is shorter than a second distance between the memory cell array region and the second page buffer. The first page buffer includes a first transistor driven in response to a first control signal. The second page buffer includes a second transistor driven in response to a second control signal corresponding to the first control signal. At least one of design constraints and processing constraints with respect to the first and second transistors is different.

16 Claims, 20 Drawing Sheets

(51) Int. Cl.

| | |
|---|---|
| *H01L 27/02* | (2006.01) |
| *H01L 21/265* | (2006.01) |
| *G11C 7/10* | (2006.01) |
| *G11C 16/26* | (2006.01) |
| *G11C 16/04* | (2006.01) |
| *G11C 16/32* | (2006.01) |
| H01L 27/11582 | (2017.01) |
| H01L 27/11573 | (2017.01) |

(56) References Cited

U.S. PATENT DOCUMENTS

| | | | |
|---|---|---|---|
| 8,724,390 B2 | 5/2014 | Hung et al. | |
| 8,848,422 B2 | 9/2014 | Tomotani et al. | |
| 9,042,175 B2 | 5/2015 | Sim et al. | |
| 129,696 A1 | 9/2015 | Joo et al. | |
| 9,218,888 B2* | 12/2015 | Yamauchi | G11C 16/0483 |
| 9,257,181 B2* | 2/2016 | Lee | G11C 16/0483 |
| 9,466,373 B2 | 10/2016 | Okada et al. | |
| 9,627,076 B2 | 4/2017 | Nam | |
| 2006/0120172 A1* | 6/2006 | Lee | G11C 16/0483 |
| | | | 365/189.05 |
| 2009/0213643 A1 | 8/2009 | Angerbauer et al. | |
| 2011/0222355 A1 | 9/2011 | Nakashima et al. | |
| 2012/0243342 A1* | 9/2012 | Lee | G11C 16/0483 |
| | | | 365/189.05 |
| 2014/0056069 A1 | 2/2014 | Park et al. | |
| 2014/0104947 A1* | 4/2014 | Yamauchi | G11C 16/0483 |
| | | | 365/185.09 |
| 2016/0125948 A1* | 5/2016 | Lee | G11C 16/0483 |
| | | | 365/185.12 |

\* cited by examiner

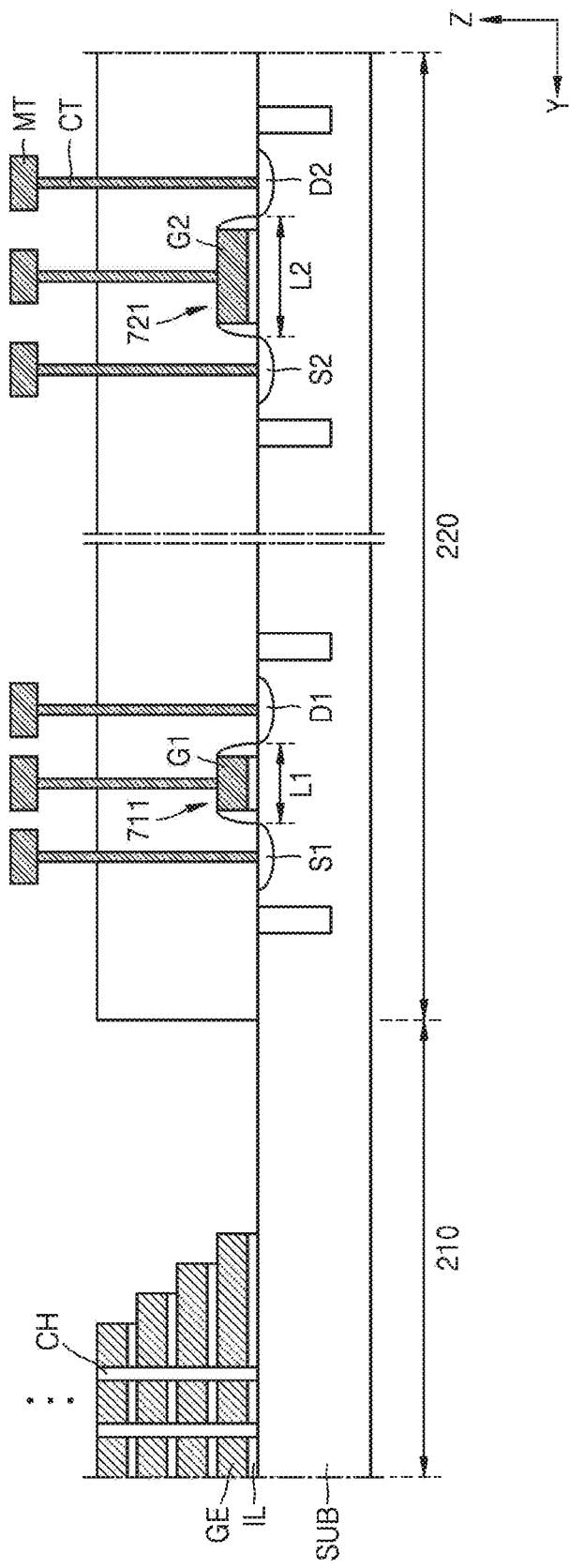

US 10,324,629 B2

NON-VOLATILE MEMORY DEVICE HAVING PAGE BUFFERS WITH DIFFERING CHARACTERISTICS

CROSS-REFERENCE TO RELATED APPLICATION

This application claims the benefits of Korean Patent Application No. 10-2017-0046937, filed on Apr. 11, 2017, in the Korean Intellectual Property Office, the disclosure of which is incorporated herein in its entirety by reference.

BACKGROUND

The disclosure relates to a non-volatile memory device, and more particularly, to a vertical non-volatile memory device including a 3-dimensional (3D) memory cell array.

Memory devices may be used to store data and are classified into volatile memory devices and non-volatile memory devices. A flash memory device, which is an example of the non-volatile memory device, may be applied to portable phones, digital cameras, personal digital assistants (PDAs), transportable computer devices, fixed computer devices, and other devices. A vertical non-volatile memory device may include a 3D memory cell array and a peripheral circuit. In this regard, transistors included in the peripheral circuit may suffer mold stress during a process of forming the 3D memory cell array.

SUMMARY

According to an aspect of the disclosure, there is provided a non-volatile memory device including a memory cell array region in which a plurality of memory cells are vertically stacked on a substrate and a page buffer region in which first and second page buffers are arranged. A first distance between the memory cell array region and the first page buffer is shorter than a second distance between the memory cell array region and the second page buffer. The first page buffer includes a first transistor driven in response to a first control signal. The second page buffer includes a second transistor driven in response to a second control signal corresponding to the first control signal. At least one of design constraints and processing constraints with respect to the first and second transistors are different.

According to another aspect of the disclosure, there is provided a non-volatile memory device including a memory cell array region in which a plurality of memory cells are vertically stacked on a substrate and a page buffer region in which first and second page buffers are arranged. A first distance between the memory cell array region and the first page buffer is shorter than a second distance between the memory cell array region and the second page buffer. The first page buffer includes a first transistor driven in response to a first control signal and having a first size. The second page buffer includes a second transistor driven in response to a second control signal corresponding to the first control signal and having a second size different from the first size.

According to another aspect of the disclosure, there is provided a manufacturing method for a non-volatile memory device, the manufacturing method including: forming a memory cell array in which memory cells are vertically stacked on a substrate; forming a first page buffer comprising a first transistor having a first tensile stress; and forming a second page buffer comprising a second transistor having a second tensile stress. A first value of a manufacturing constraint for forming the first transistor is different from a second value for the same manufacturing constraint for forming the second transistor. The first and second values of the manufacturing constraint are selected to reduce a threshold voltage difference existing between the first and second transistors due to a difference in the first and second tensile stresses of the first and second transistors.

BRIEF DESCRIPTION OF THE DRAWINGS

Embodiments of the disclosure will be more clearly understood from the following detailed description taken in conjunction with the accompanying drawings in which:

FIG. 10 is a cross-sectional view illustrating a non-volatile memory device, according to an embodiment;

DETAILED DESCRIPTION OF THE EMBODIMENTS

Figure 1:
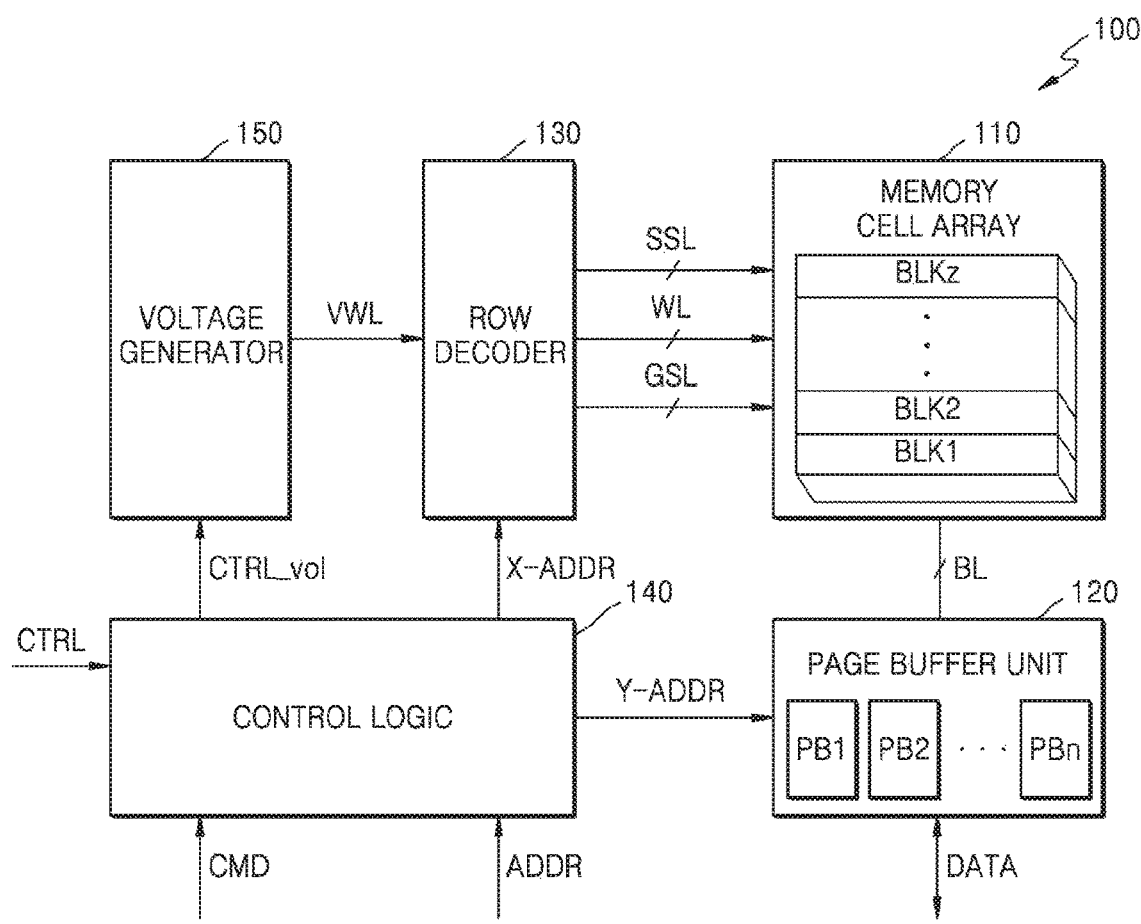
FIG. 1 is a block diagram of a non-volatile memory device according to an embodiment.

FIG. 1 is a block diagram of a non-volatile memory device 100 according to an embodiment. Referring to FIG. 1, the non-volatile memory device 100 may include a memory cell array 110, a page buffer unit 120, a row decoder 130, control logic 140, and a voltage generator 150.

Although not shown, the memory device 100 may further include a data input/output circuit or an input/output interface.

The memory cell array 110 may be coupled to the page buffer unit 120 via bit lines BL and may be coupled to the row decoder 130 via word lines WL, string select lines SSL, and ground select lines GSL. The memory cell array 110 may include a plurality of NAND strings. Each NAND string may include a plurality of memory cells. For example, the memory cells may be flash memory cells. Hereinafter, embodiments of the present disclosure will be described in detail by describing a case where the memory cells are NAND flash memory cells. However, the disclosure is not limited thereto. The memory cells may be resistive memory cells such as a resistive RAM (ReRAM), a phase change RAM (PRAM), or a magnetic RAM (MRAM).

Each memory cell may store one or more bits. Specifically, each memory cell may be a single level cell (SLC), a multi level cell (MLC), or a triple level cell (TLC). In an embodiment, some memory blocks of the plurality of memory blocks BLK1 to BLKz included in the memory cell array 110 may be SLC blocks and the other memory blocks may be MLC blocks or TLC blocks.

The memory cell array 110 may include a 3-dimensional (3D) memory cell array. Each NAND string may include memory cells each connected to vertically stacked word lines on a substrate. The 3D memory cell array may be monolithically formed in one or more physical levels of memory cell arrays having an active area provided above a silicon substrate and circuitry associated with the operation of memory cells, wherein such associated circuitry may be above or within the silicon substrate. The term "monolithic" means that layers of each level of the 3D memory cell array are directly deposited on the layers of each underlying level of the 3D memory cell array.

In an embodiment, the 3D memory cell array may include NAND strings in which at least one memory cell is located on another memory cell in a vertical direction. The at least one memory cell may include a charge trap layer. The following patent documents, which are hereby incorporated in their entireties by reference, disclose suitable configurations for 3D memory arrays, in which the 3D memory array is configured at a plurality of levels, with word lines and/or bit lines shared between levels: U.S. Pat. Nos. 7,679,133; 8,553,466; 8,654,587; 8,559,235; and US Pat. Pub. No. 2011/0233648.

The control logic 140 may output various control signals for writing data, DATA, to the memory cell array 110 or reading data, DATA, from the memory cell array 110 based on a command CMD, an address ADDR, and a control signal CTRL, which are received from a memory controller. Thus, the control logic 140 may generally control various internal operations of the memory device 100. Specifically, the control logic 140 may provide a voltage control signal CTRL_vol to the voltage generator 150, provide a row address X-ADDR to the row decoder 130, and provide a column address Y-ADDR to the page buffer unit 120. However, the disclosure is not limited thereto, and the control logic 140 may further provide control signals to the voltage generator 150, the row decoder 130, and the page buffer unit 120.

The voltage generator 150 may generate various kinds of voltages for performing a program operation, a read operation, and an erase operation on the memory cell array 110, based on a voltage control signal CTRL_vol. Specifically, the voltage generator 150 may generate a word line voltage VWL, for example, a program voltage, a read voltage, a pass voltage, an erase verification voltage, or a program verification voltage. Also, the voltage generator 150 may further generate a string selection line voltage and a ground selection line voltage based on the voltage control signal CTRL_vol. Also, the voltage generator 150 may further generate an erase voltage to be provided to the memory cell array 110.

In response to the row address X-ADDR, the row decoder 130 may select one of memory blocks BLK1 to BLKz, select one of word lines WL of a selected memory block, and select one of a plurality of string selection lines SSL. The page buffer unit 120 may select some of the bit lines BL in response to a column address Y-ADDR. Specifically, the page buffer unit 120 may operate as a write driver or a sense amplifier depending on an operation mode.

The page buffer unit 120 may include a plurality of page buffers PB1 to PBn. In an embodiment, each page buffer may be coupled to one bit line. In an embodiment, each page buffer may be connected to one bit line group, and a plurality of bit lines included in one bit line group may share one page buffer. For example, four bit lines may form one bit line group, and four bit lines may share one page buffer.

Each of the plurality of page buffers PB1 to PBn may have substantially the same configuration as each other. Specifically, the plurality of page buffers PB1 to PBn may each include transistors (e.g., TRa to TRn in FIG. 4) that perform the same equivalent functions. In an embodiment, at least one of design constraints and processing constraints for the transistors may be different. This will be described in more detail with reference to FIG. 4.

Figure 2:
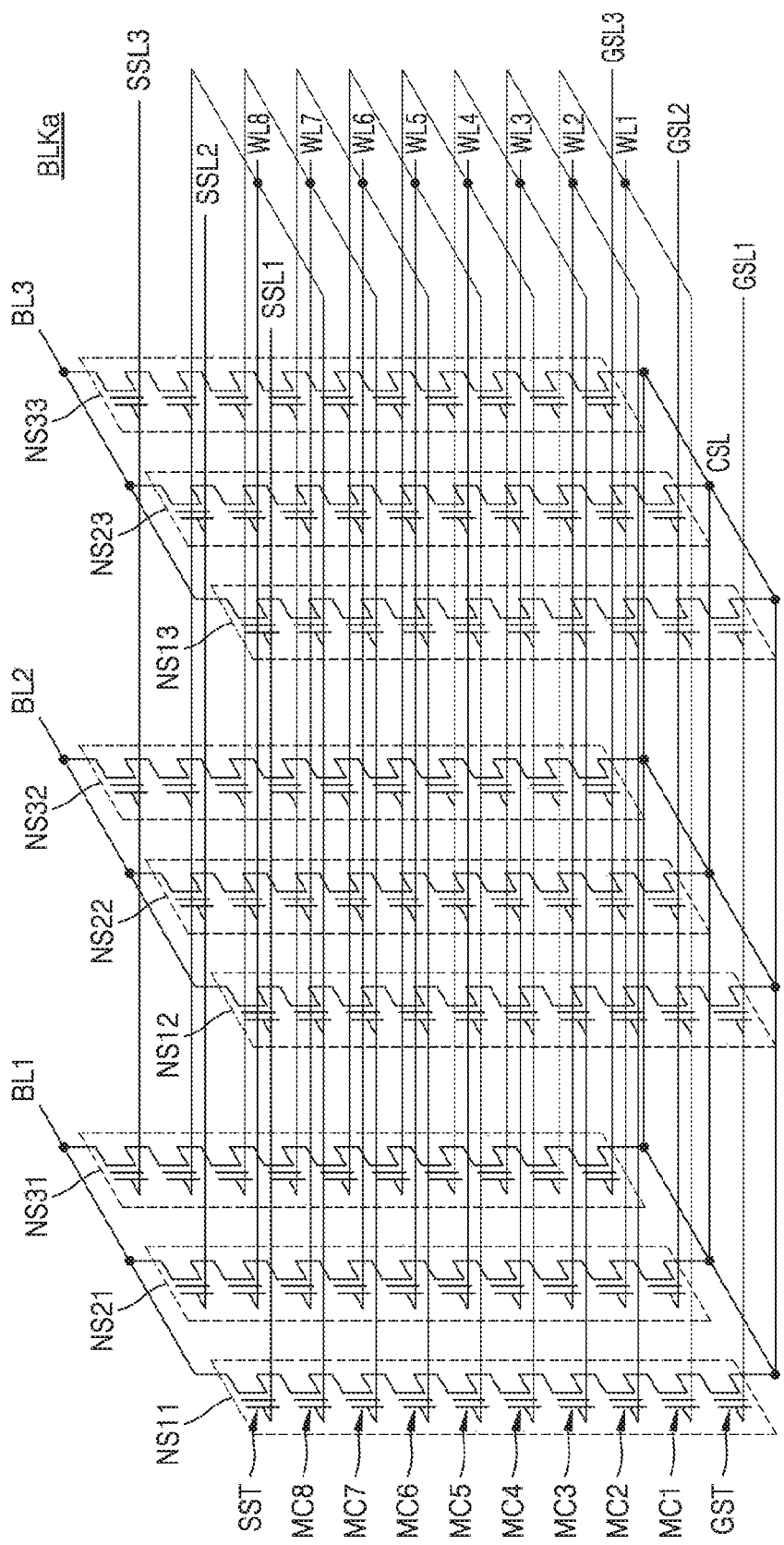
FIG. 2 is an equivalent circuit diagram of an example of a memory block included in a memory cell array of FIG. 1.

FIG. 2 is an equivalent circuit diagram of an example of a memory block BLKa included in the memory cell array 110 of FIG. 1.

Referring to FIG. 2, the memory block BLKa may correspond to one of the memory blocks BLK1 through BLKz and include a plurality of strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. The number of NAND strings, the number of word lines, the number of bit lines, the number of ground selection lines, and the number of string selection lines may be variously changed according to embodiments.

The NAND strings NS11, NS21, and NS31 may be provided between the first bit line BL1 and the common source line CSL. The NAND strings NS12, NS22, and NS32 may be provided between the second bit line BL2 and the common source line CSL. The NAND strings NS13, NS23, and NS33 may be provided between the third bit line BL3 and the common source line CSL. Each of the NAND strings, for example, the NAND string NS11, may include a string selection transistor SST, a plurality of memory cells MC1 to MC8, and a ground selection transistor GST, which may be connected in series. Hereinafter, the NAND string will be referred to as a string for convenience.

The string selection transistors SST may be connected to the string selection lines SSL1 to SSL3 corresponding thereto. The plurality of memory cells MC1 to MC8 may be respectively connected to the word line WL1 to WL8 corresponding thereto. The ground selection transistors GST may be connected to the ground selection lines GSL1 to GSL3 corresponding thereto. The string selection transistors SST may be connected to the bit lines BL1 to BL3 corresponding thereto. The ground selection transistors GST may be connected to the common source line CSL.

In the present embodiment, word lines (e.g., WL1) located at the same level may be connected in common to one another, the string selection lines SSL1 to SSL3 may be separated from one another, and the ground selection lines GSL1 to GSL3 may also be separated from one another. Although FIG. 2 illustrates a case in which word lines located at the same level are shared among the three string selection lines SSL1 to SSL3, the disclosure is not limited thereto. For example, word lines located at the same level may be shared between two string selection lines. For another example, word lines located at the same level may be shared among four string selection lines.

Although FIG. 2 illustrates a case in which each string may include one string selection transistor SST, the disclosure is not limited thereto. Each string may include an upper string selection transistor and a lower string selection transistor, which are connected in series. Also, although FIG. 2 illustrates a case in which each string may include one ground selection transistor GST, the disclosure is not limited thereto. Each string may include an upper ground selection transistor and a lower ground selection transistor, which are connected in series. In this case, upper ground selection transistors may be connected to the ground selection lines GSL1 to GSL3 corresponding thereto, while lower ground selection transistors may be connected in common to a common ground selection line.

Figure 3:
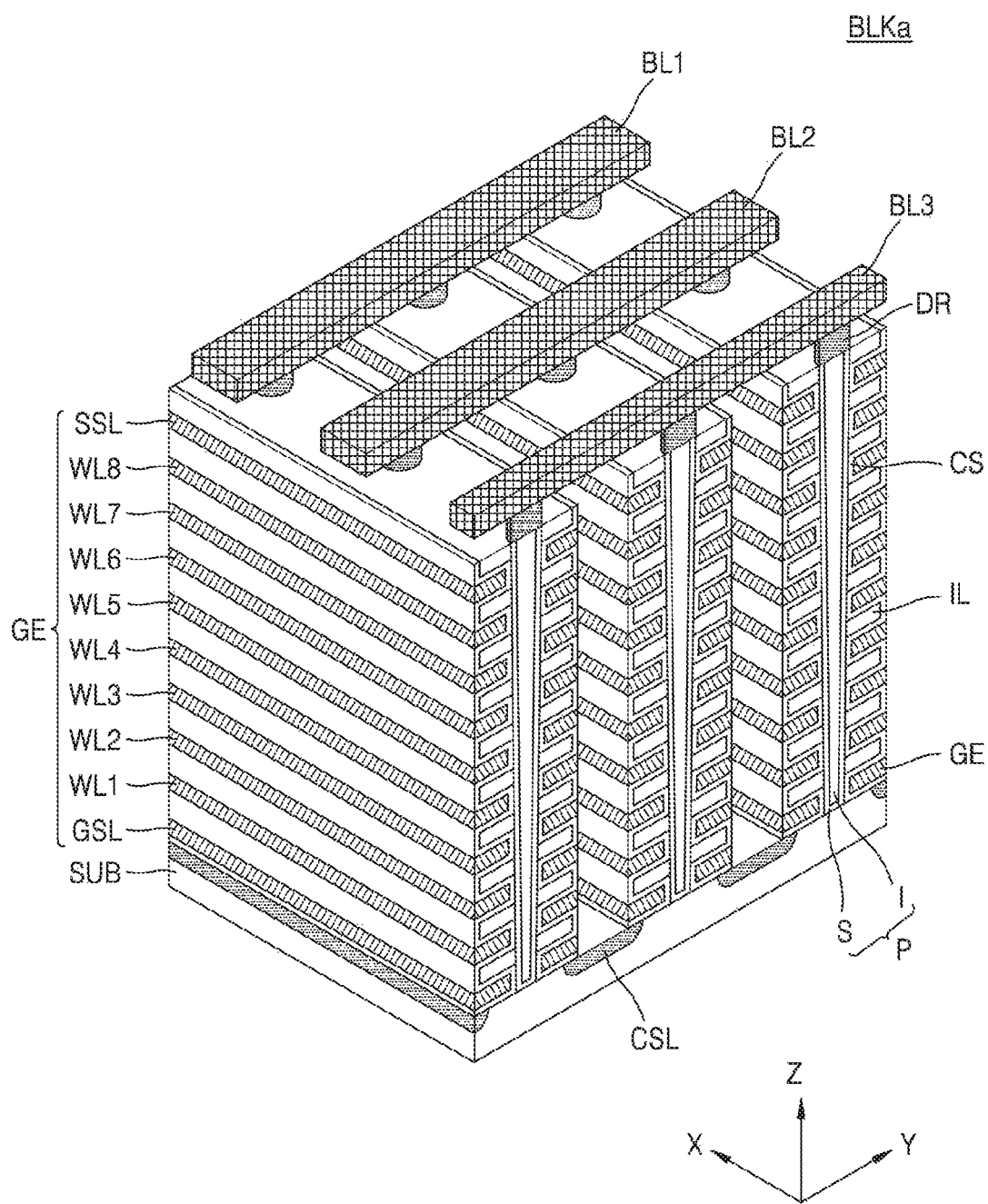
FIG. 3 is a perspective view of the memory block of FIG. 2.

FIG. 3 is a perspective view of the memory block BLKa of FIG. 2.

Referring to FIG. 3, the memory block BLKa may be provided in a vertical direction to a substrate SUB. Although FIG. 3 illustrates that the memory block BLKa may include two selection lines GSL and SSL, eight word lines WL1 to WL8, and three bit lines BL1 to BL3, the memory block BLKa may actually include more or fewer selection lines, word lines, and bit lines than those described above.

The substrate SUB may have a first conductivity type (e.g., a p-type). A common source line CSL may be provided on the substrate SUB and extend in an X direction and may be doped with impurities of a second conductivity type (e.g., an n-type). A plurality of insulating layers IL may be provided on a region of the substrate SUB between two adjacent common source lines CSL, may extend in the X direction, may be sequentially provided in a Z direction, and may be spaced a predetermined distance apart from one another in the Z direction. For example, the plurality of insulating layers IL may include an insulating material, such as silicon oxide.

A plurality of pillars P may be provided on a region of the substrate SUB between two adjacent common source lines CSL, may be sequentially arranged in the X direction, and may penetrate the plurality of insulating layers IL in the Z direction. For example, the plurality of pillars P may penetrate the plurality of insulating layers IL and contact the substrate SUB. Specifically, a surface layer S of each of the pillars P may include a first type silicon material and function as a channel region. Meanwhile, an inner layer I of each of the pillars P may include an insulating material or an air gap.

A charge storage layer CS may be provided along exposed surfaces of the insulating films IL, the pillars P, and the substrate SUB between two adjacent common source lines CSL. The charge storage layer CS may include a gate insulating layer (also referred to as a 'tunneling insulating layer'), a charge trap layer, and a blocking insulating layer. For example, the charge storage layer CS may have an oxide-nitride-oxide (ONO) structure. Also, gate electrodes GE, such as the selection lines GSL and SSL and the word lines WL1 to WL8, may be provided on an exposed surface of the charge storage layer CS in a region between two adjacent common source lines CSL.

Drain contacts DR may be provided on the plurality of pillars P, respectively. For example, the drain contacts DR may include a silicon material doped with impurities having a second conductivity type. The bit lines BL1 to BL3 may be provided on the drains DR, may extend in a Y direction, and may be spaced a predetermined distance apart from one another in the X direction.

Figure 4:
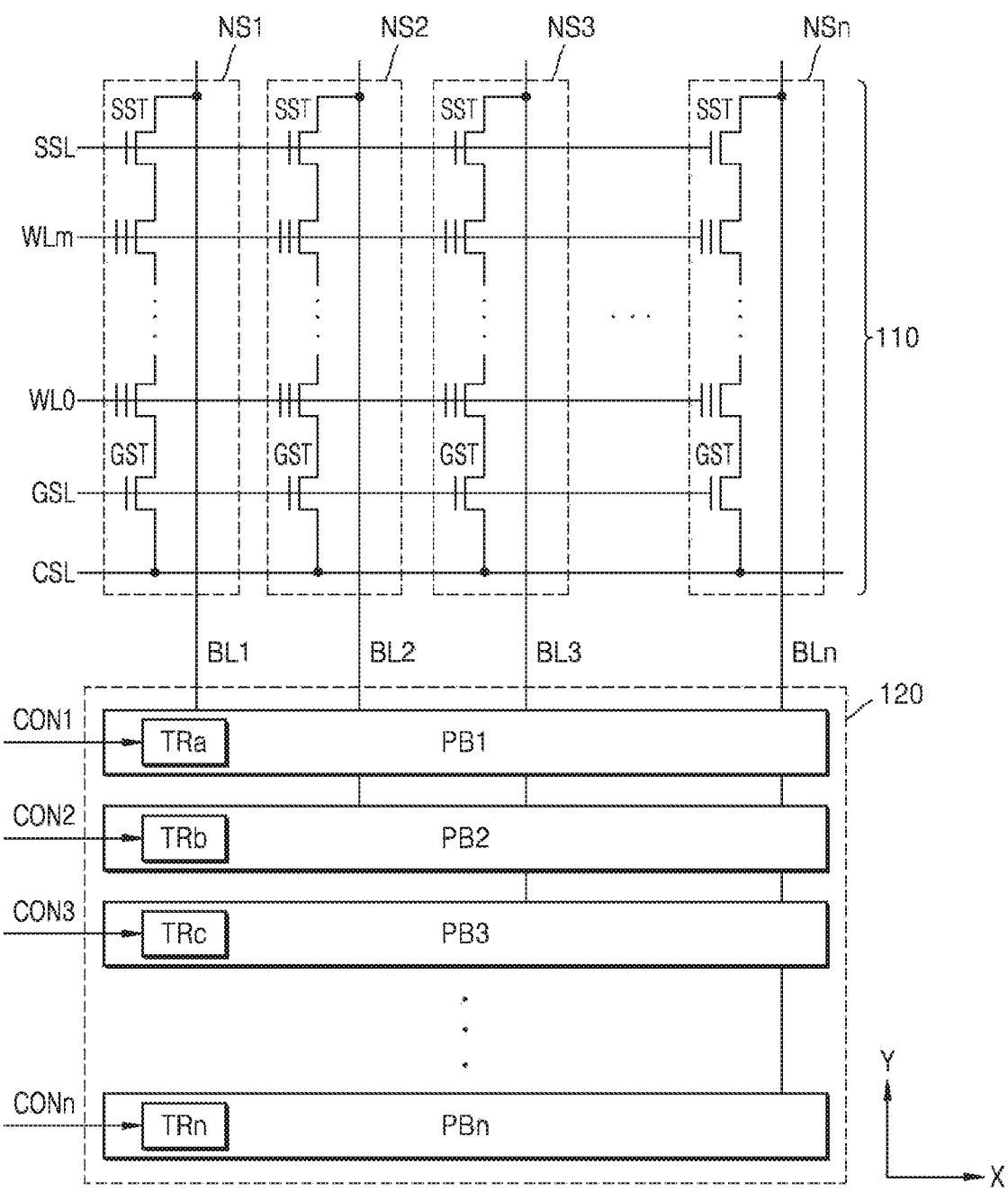
FIG. 4 illustrates in detail a memory cell array and a page buffer unit, according) an embodiment.

FIG. 4 illustrates in detail the memory cell array 110 and the page buffer unit 120, according to an embodiment.

Referring to FIG. 4, the memory cell array 110 may include first through nth NAND strings NS1 through NSn and the page buffer unit 120 may include first through nth page buffers PB1 through PBn. The first page buffer PB1 may be connected to the first NAND string NS1 through the first bit line BL1. The second page buffer PB2 may be connected to the second NAND string NS2 through the second bit line BL2. The nth page buffer PBn may be connected to the nth NAND string NSn through the nth bit line BLn.

In an embodiment, the first through nth page buffers PB1 through PBn may be adjacent to each other along a first direction (e.g., a Y direction). Accordingly, the first page buffer PB1 may be closest to the memory cell array 110 and the second page buffer PB2 may be secondly adjacent to the memory cell array 110. As described above, the first through nth page buffers PB1 through PBn may be arranged in different locations along the Y direction, and thus distances from the memory cell array 110 to the first through nth page buffers PB1 through PBn may be different from each other.

The first through nth page buffers PB1 through PBn may include first through nth transistors TRa through TRn, respectively, which perform corresponding same functions. Specifically, during read and write operations on memory cells included in the memory cell array 110, the first to nth transistors TRa to TRn may respectively perform the same corresponding functions as the first to nth page buffers PB1 to PBn. Accordingly, the first to nth transistors TRa to TRn may be referred to as the same purpose transistors.

The first to nth transistors TRa to TRn may be driven according to the corresponding first to nth control signals CON1 to CONn, respectively. The first through nth control signals CON1 through CONn may be received from the control logic (e.g., 140 in FIG. 1). In an embodiment, voltage levels of the first to the nth control signals CON1 to CONn may be equal to each other in a period in which the first to nth page buffers PB1 to PBn are activated. However, the disclosure is not limited thereto. In some embodiments, the voltage levels of the first to the nth control signals CON1 to CONn may be different from each other in a part of the period in which the first to nth page buffers PB1 to PBn are activated.

According to embodiments, design constraints for the first to nth transistors TRa to TRn may be different from each other. In an embodiment, a design constraint may be a transistor size, and sizes of the first to nth transistors TRa to TRn may be different from each other. For example, a width of the first transistor TRa may be different from a width of the second transistor TRb. For example, a length of the second transistor TRa may be different from a length of the second transistor TRb. This will be described later with reference to FIGS. 7 to 11. In an embodiment, the design constraint may be a placement in a layout, and the first to nth transistors TRa to TRn may be arranged at different locations in a region where the page buffers PB1 to PBn are arranged. This will be described later with reference to FIGS. 12 to 14B.

According to embodiments, processing constraints for the first to nth transistors TRa to TRn may be different from each other. In an embodiment, a process constraint may be an implant concentration applied to ion implant processing for transistor formation, and implant concentrations for the first through nth transistors TRa through TRn may be different. For example, a first implant concentration for the first transistor TRa may be higher than a second implant concentration for the second transistor TRb.

Figure 5A:
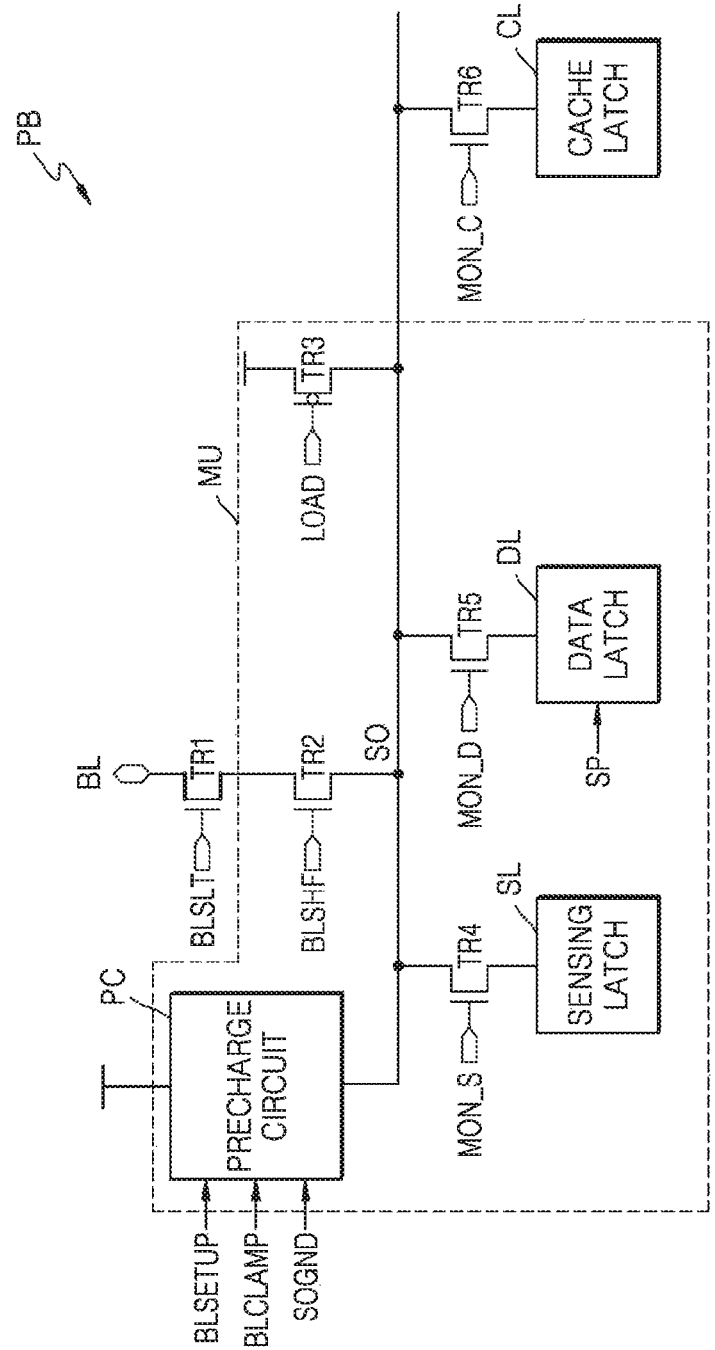
FIG. 5A is a circuit diagram showing an example of a page buffer, according to an embodiment.

FIG. 5A is a circuit diagram showing an example of a page buffer PB, according to an embodiment.

Referring to FIG. 5A, the page buffer PB may correspond to one of the first through nth page buffers PB1 through PBn of FIG. 4. The first through nth page buffers PB1 through PBn may have substantially the same configuration. The page buffer PB may include a precharge circuit PC, a sensing latch SL, a data latch DL, and a cache latch CL that are connected to the sensing node SO. The number of data latches DL may be changed according to data bits stored in memory cells. The page buffer PB may further include a bit line selection transistor TR1, a bit line voltage control transistor TR2, a precharge transistor TR3 and monitoring transistors TR4 to TR6. The gate of monitoring transistor TR5 is controlled by monitor control signal MON_D, and the gate of monitoring transistor TR6 is controlled by monitor control signal MON_C.

In the page buffer PB, the precharge circuit PC, the bit line voltage control transistor TR2, the precharge transistor TR3, the monitoring transistors TR4 and TR5, the sensing latch SL and the data latch DL may constitute a main unit MU. The main unit MU may include main transistors in the page buffer PB. In the present specification, the "page buffer" may actually refer to a "main unit". Since the bit line select transistor TR1 is embodied as a high voltage transistor, high voltage transistors included in a plurality of page buffers may be arranged in a different well region from the main unit MU. In addition, since the cache latch CL is directly connected to the data line, cache latches included in the plurality of page buffers may be arranged at a lower end of a page buffer region.

The page buffer PB may be connected to the NAND string via the bit line BL. The page buffer PB verifies whether or not a selected memory cell among the memory cells included in the NAND string is completely programmed during a program operation. Specifically, the page buffer PB stores data sensed through the bit line BL in the sensing latch SL during a program verification operation. The data latch DL in which target data is stored according to the sensed data stored in the sensing latch SL is set. For example, if the sensed data indicates that a program has been completed, the data latch DL is switched to a program inhibit setting for the selected memory cell in a subsequent program loop.

The page buffer PB may receive a set pulse SP for storing data stored in the sensing latch SL into the data latch DL, from the control logic (for example, 140 in FIG. 1). In response to the set pulse SP, the page buffer PB may set the data latch DL in accordance with the data stored in the sensing latch SL. The cache latch CL may temporarily store input data, DATA, provided from the outside. During the program operation, the target data stored in the cache latch CL may be stored in the data latch DL.

Figure 5B:
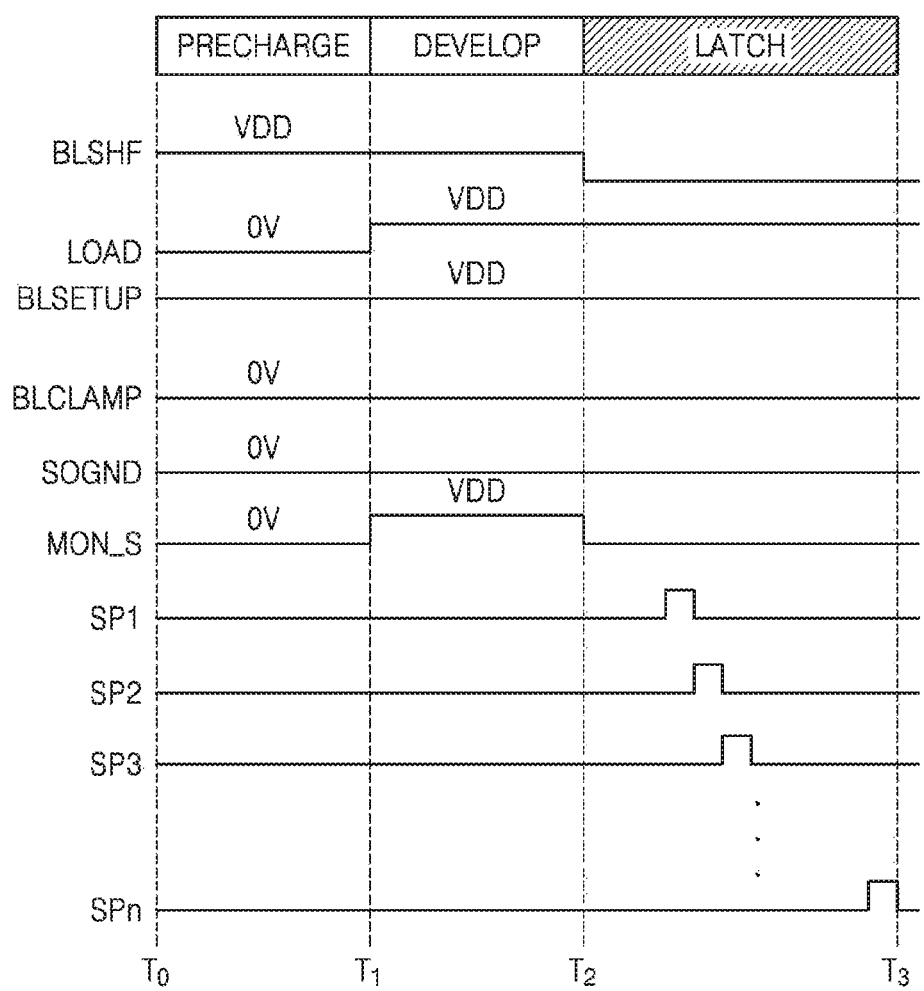
FIG. 5B is a timing diagram illustrating control signals applied to the page buffer of FIG. 5A.

FIG. 5B is a timing diagram illustrating control signals applied to the page buffer PB of FIG. 5A.

Referring to FIGS. 5A and 5B, at a time $T_0$, a precharge control signal LOAD is provided at a low level (for example, 0V) in order to precharge the sensing node SO. Thereby, the precharge transistor TR3 may be turned on, and a voltage level of the sensing node SO may rise to a power supply voltage level (for example, VDD). In addition, a bit line voltage control signal BLSHF is transited to the power supply voltage level (for example, VDD) in order to precharge the bit line BL connected to the sensing node SO. Thus, the bit line voltage control transistor TR2 may be turned on, and a voltage level of the bit line BL may rise to a predetermined bit line voltage. The precharge operation for the bit line BL is performed until the precharge transistor TR3 is turned off. At this time, a bit line clamping control signal BLCLAMP, a ground control signal SOGND, and a monitor control signal MON_S may be provided to a low level (for example, 0V) and a bit line setup control signal BLSETUP may be provided to the power supply voltage level (for example, VDD).

At a time $T_1$, a developing operation of the sensing node SO proceeds. The precharge control signal LOAD and the monitor control signal MON_S are transited to the power supply voltage level (for example, VDD) for development of the sensing node SO. Accordingly, a voltage of the sensing node SO may be reduced corresponding to a program state of a selected memory cell, and a voltage of the sensing node SO may be stored in the sensing latch SL. At a time $T_2$, data may be latched in the data latch DL according to the data stored in the sensing latch SL. At this time, set pulses SP1 to SPn for the data latches DL of the first to nth page buffers PB1 to PBn may be sequentially applied.

In an embodiment, a same purpose transistor included in each page buffer may include the bit line voltage control transistor TR2 to which the bit line voltage control signal BLSHF is applied, the precharge control transistor TR3 to which the precharge control signal LOAD is applied, transistors to which the bit line set-up signal BLSETUP, the bit line clamping control signal BLCLAMP, the ground control signal SOGND, and the monitor control signal MON_S are respectively applied, or transistors included in the sensing latch SL. At this time, voltage levels of control signals applied to same purpose transistors included in different page buffers may be the same.

In an embodiment, the same purpose transistor included in each page buffer may be a transistor to which the set pulses SP1 to SPn are applied. At this time, the voltage levels of control signals applied to the same purpose transistors included in different page buffers may be different from each other.

Figure 6:
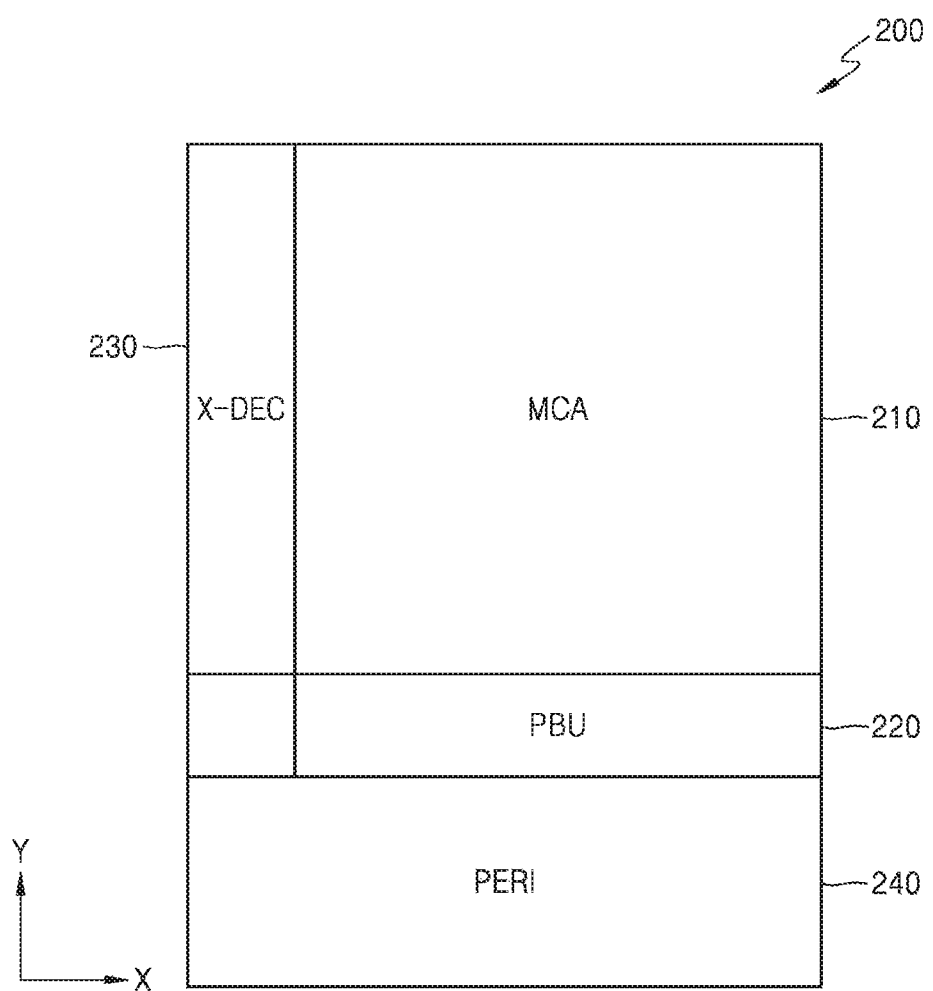
FIG. 6 is a layout of a non-volatile memory device, according to an embodiment.

FIG. 6 is a layout of a non-volatile memory device 200, according to an embodiment.

Referring to FIG. 6, the non-volatile memory device 200 may include a memory cell array region 210, a page buffer region 220, a row decoder region 230, and a peripheral circuit region 240. In the memory cell array region 210, a plurality of vertically stacked memory cells may be arranged on a substrate. For example, the memory cell array 110 of FIG. 1 may be arranged in the memory cell array region 210. The page buffer region 220 may be adjacent to the memory cell array region 210 in a first direction (e.g., a Y direction), and a plurality of page buffers may be arranged. For example, the page buffer unit 120 of FIG. 1 may be arranged in the page buffer region 220.

Also, the row decoder 130 of FIG. 1 may be arranged in the row decoder region 230 and the control logic 140 and the voltage generating portion 150 of FIG. 1 may be arranged in the peripheral circuit region 240. Various methods of compensating for threshold voltage variations of transistors arranged in the page buffer region 220 will now be described below. However, the disclosure is not limited thereto. Various embodiments according to the disclosure may also be applied to compensate for the threshold voltage variations of the transistors arranged in the row decoder region 230 and the peripheral circuit region 240.

Figure 7:
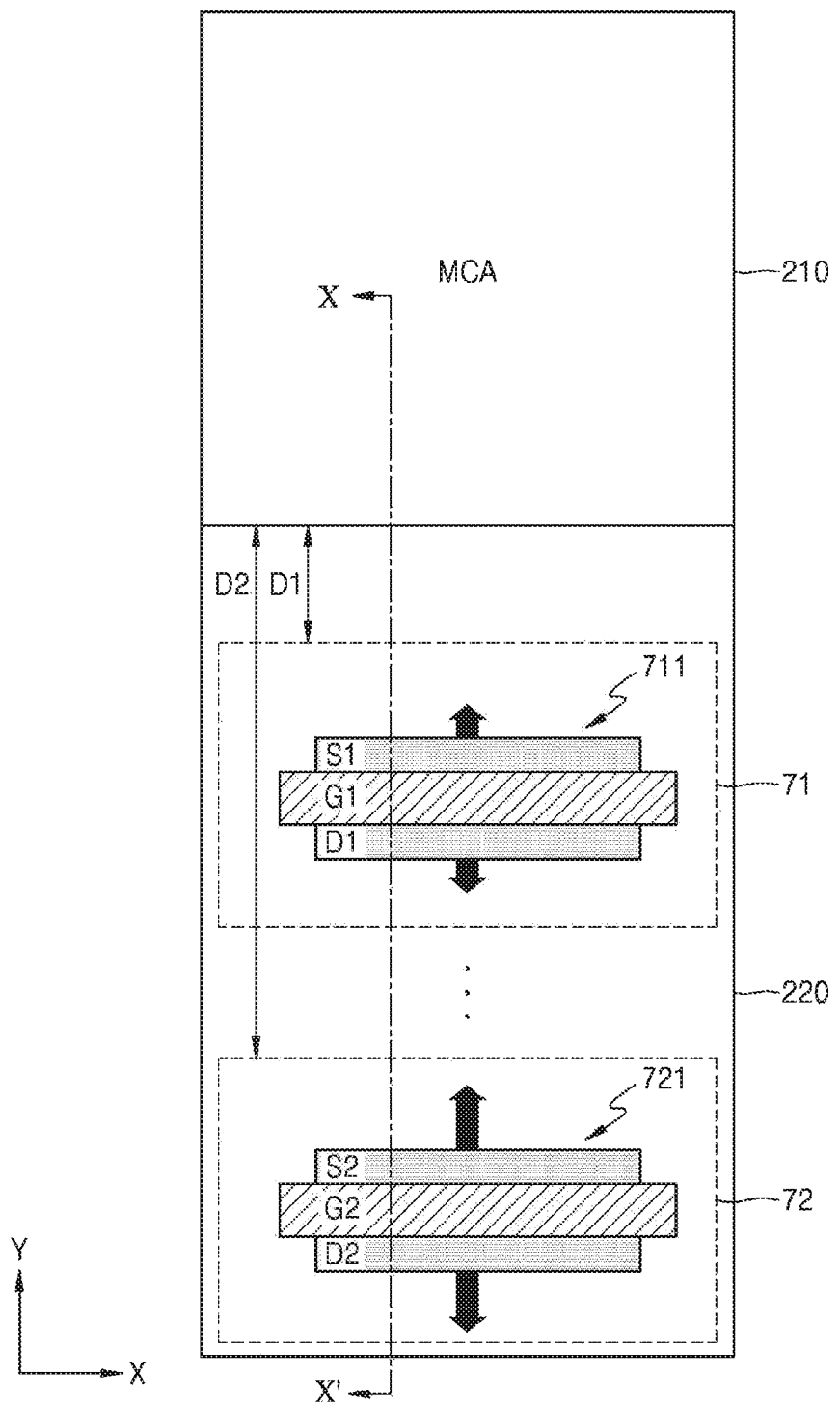
FIG. 7 is a schematic top view illustrating first and second page buffers arranged in a page buffer region of FIG. 6.

FIG. 7 is a schematic top view illustrating first and second page buffers 71, 72 arranged in the page buffer region 220 of FIG. 6.

Referring to FIG. 7, a first distance D1 in a first direction between the first page buffer 71 and the memory cell array region 210 may be shorter than a second distance D2 in the first direction between the second page buffer 72 and the memory cell array region 210. In other words, the first page buffer 71 may be an example of an upper page buffer adjacent to the memory cell array region 210, and the second page buffer 72 may be an example of a lower page buffer spaced in the memory cell array region 210.

The first and second page buffers 71 and 72 may include first and second transistors 711 and 721, respectively. The first and second transistors 711 and 721 may perform the same functions in the first and second page buffers 71 and 72. Accordingly, the first and second transistors 711 and 721 may be referred to as same purpose transistors or same function transistors.

Specifically, the first transistor 711 may include a source S1, a gate G1, and a drain D1, and may be driven in response to a first control signal. The second transistor 721 may include a source S2, a gate G2, and a drain D2, and may be driven in response to a second control signal corresponding to the first control signal. For example, the first and second control signals may be the bit line voltage control signals BLSHF of FIG. 4, and the first and second transistors 711 and 721 may be the bit line voltage control transistors TR2. At this time, when the first and second page buffers 71 and 72 are activated, the first and second control signals may have the same voltage level.

In order to arrange the memory cells vertically in the memory cell array region 210, a stepwise mold structure forming process may be performed. Due to mold stress occurring during this process, threshold voltage variation of the transistors may occur according to locations of the page buffers in the page buffer region 220. Hereinafter, causes of the threshold voltage variation of the transistors according to the locations of the page buffers and specific aspects thereof will be described in detail.

Specifically, in the page buffer region 220, when directions of global stress due to wafer warpage and local stress due to chip warpage are the same, the second transistor 721 in the second page buffer 72 arranged in a lower end of the page buffer region 220 may have a larger tensile stress. Accordingly, when the first and second transistors 711 and 721 are n-channel metal-oxide-semiconductor (NMOS) transistors, a threshold voltage of the second transistor 721 may be lower than a threshold voltage of the first transistor 711. Meanwhile, when the first and second transistors 711 and 721 are p-channel metal-oxide-semiconductor (PMOS) transistors, the threshold voltage of the second transistor 721 may be higher than the threshold voltage of the first transistor 711.

When the transistor is in a tensile state, impurity diffusion, for example, a boron diffusion phenomenon, may be intensified. An amount of boron diffusion of the second transistor 721 arranged in a lower end of the page buffer region 220 may be greater than an amount of boron diffusion of the first transistor 711 arranged in an upper end of the page buffer region 220. Accordingly, when the first and second transistors 711 and 721 are NMOS transistors, the threshold voltage of the second transistor 721 may be lower than the threshold voltage of the first transistor 711. Meanwhile, when the first and second transistors 711 and 721 are PMOS transistors, the threshold voltage of the second transistor 721 may be higher than the threshold voltage of the first transistor 711.

Figure 8:
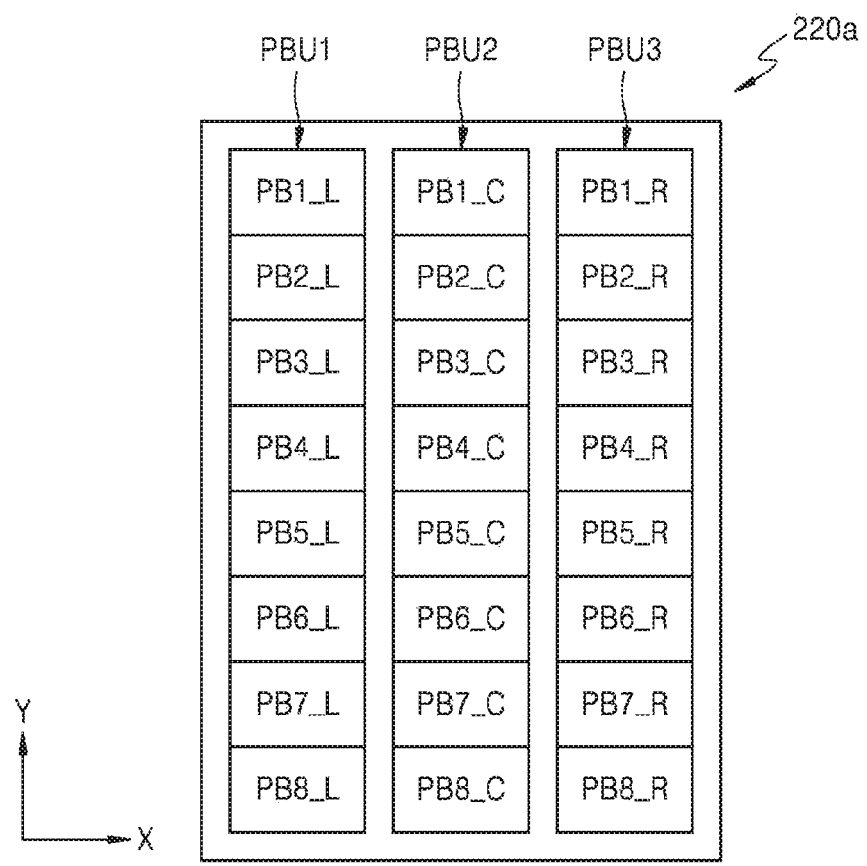
FIG. 8 is a layout of an example of a page buffer region, according to an embodiment.

FIG. 8 is a layout of an example of a page buffer region 220a, according to an embodiment.

Referring to FIG. 8, the page buffer region 220a may correspond to an example of the page buffer region 220 of FIG. 6. For example, the page buffer region 220a may include first to third page buffer units PBU1 to PBU3 adjacent in a second direction (e.g., an X direction). The first page buffer unit PBU1 may include first through eighth page buffers PB1_L through PB8_L adjacent in a first direction (e.g., a Y direction). The second page buffer unit PBU2 may include first through eighth page buffers PB1_C through PB8_C adjacent in the first direction. The third page buffer unit PBU3 may include first through eighth page buffers PB1_R through PB8_R adjacent in the first direction.

Figure 9A:
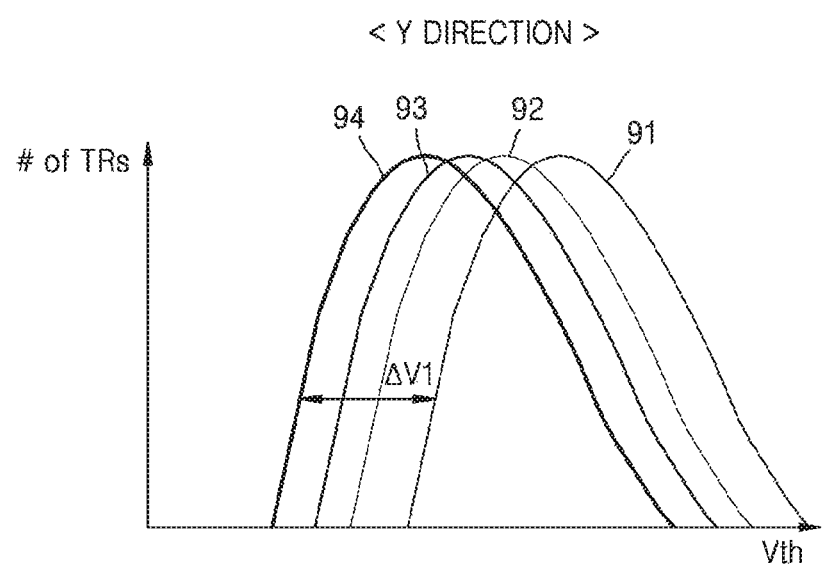
FIG. 9A shows threshold voltage distributions of transistors included in page buffers arranged at different Y points in FIG. 8.
Figure 9B:
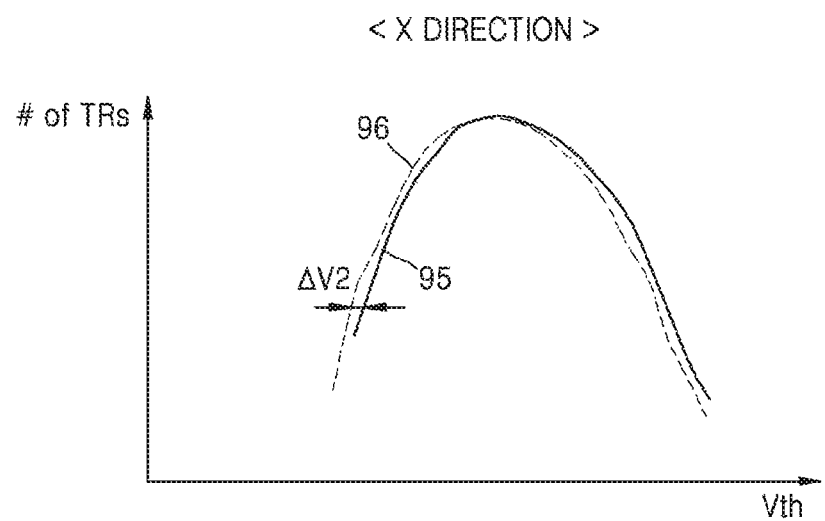
FIG. 9B shows threshold voltage distributions of transistors included in page buffers arranged at different X points in FIG. 8.

FIG. 9A shows threshold voltage distributions of transistors included in page buffers arranged at different Y points in FIG. 8. FIG. 9B shows threshold voltage distributions of transistors included in page buffers arranged at different X points in FIG. 8. For example, FIGS. 9A and 9B may illustrate the threshold voltage distributions of the bit line voltage control transistor (e.g., TR2 in FIG. 4) included in each page buffer.

Referring to FIGS. 8 and 9A, a horizontal axis represents a threshold voltage (Vth) of the transistor, and a vertical axis represents the number of transistors. A first distribution 91 represents a distribution of the transistors included in the page buffers (e.g., PB1_L to PB2_R) having a distance in a first direction to a memory cell array region that is less than a first value, a second distribution 92 represents a distribution of the transistors included in the page buffers (e.g., PB3_L to PB4_R) having a distance in the first direction from the memory cell array region that is greater than or equal to the first value and less than a second value, a third distribution 93 represents a distribution of the transistors included in the page buffers (e.g., PB5_L to PB6_R) having a distance in the first direction from the memory cell array region that is greater than or equal to the second value and less than a third value, and a fourth distribution 94 represents a distribution of the transistors included in the page buffers (e.g., PB7_L to PB8_R) having a distance in the first direction to the memory cell array region that is equal to or greater than the third value. A first skew $\Delta V1$ which is a threshold voltage skew between the first distribution 91 and the fourth distribution 94 may be relatively large. For example, the first skew $\Delta V1$ may be about 90 mV.

Referring to FIGS. 8 and 9B, a horizontal axis represents the threshold voltage (Vth) of the transistor, and a vertical axis represents the number of transistors. A fifth distribution 95 represents a distribution of the transistors included in the page buffers (e.g., PB1_C, PB2_C, etc.) located in a central region in the page buffer region 220a. A sixth distribution 96 represents a distribution of the transistors included in the page buffers (e.g., PB1_L, PB2_L, etc.) arranged in an edge region in the page buffer region 220a. A second skew $\Delta V2$ that is a threshold voltage skew between the fifth distribution 95 and the sixth distribution 96 may be relatively small. For example, the second skew $\Delta V2$ may be about 5 mV.

As described above, in the page buffer region 220a, variation of a threshold voltage (i.e., the first skew $\Delta V1$) of the transistors according to locations of the page buffers in the Y direction may be much greater than variation of a threshold voltage (i.e., the second skew $\Delta V2$) of the transistors according to locations of the page buffers in the X direction. Therefore, various methods of compensating for the threshold voltage of the transistors varying according to the locations of the page buffers in the Y direction will be described below. However, the disclosure may be applied not only to page buffers arranged at different locations in the Y direction, but also to page buffers arranged at different locations in the X direction.

FIG. 10 is a cross-sectional view illustrating a non-volatile memory device, according to an embodiment. For example, FIG. 10 may correspond to a cross-sectional view taken along a line X-X' in FIG. 7.

Referring to FIGS. 7 and 10, the substrate SUB may be divided into the memory cell array region 210 and the page buffer region 220. A memory cell array including a stack structure of interlayer insulating films IL and gate electrodes GE and channel holes CH may be formed in the memory cell array region 210. The page buffer region 220 may include a first transistor 711 including a gate electrode G1, a source S1 and a drain D1 and a second transistor 721 including a gate electrode G2, a source S2 and a drain D2. Contacts CT may be respectively formed on the gate electrodes G1 and G2, the sources S1 and S2, and the drains D1 and D2. Metal patterns MT may be respectively formed on the contacts CT.

In an embodiment, the first and second transistors 711 and 721 may be NMOS transistors. The first and second transistors 711 and 721 may be included in the first and second page buffers, respectively, and may perform the same function. In an embodiment, a first channel length L1 of the first transistor 711 may be less than a second channel length L2 of the second transistor 721. In an embodiment, a first width of the first transistor 711 may be less than a second width of the second transistor 721. In an embodiment, the first channel length L1 and the first width of the first transistor 711 may be smaller than the second channel length L2 and the second width of the second transistor 721, respectively.

As described above, a first size of the first transistor 711 included in a first page buffer which is relatively adjacent to the memory cell array region 210 may be smaller than a second size of the second transistor 712 included in a second page buffer that is relatively far from the memory cell array region 210. The smaller the size of the transistor, the smaller the threshold voltage, and the larger the size, the more the threshold voltage increases. Thus, the threshold voltage of the first transistor 711 may be lowered, thereby reducing a threshold voltage variation between the first and second transistors 711 and 721. As described above, according to the present embodiment, the sizes of the first and second transistors 711 and 721 may be determined differently, thereby compensating for a threshold voltage change between the first and second transistors 711 and 721.

Although not shown, the first and second transistors 711 and 721 may correspond to first and second PMOS transistors. The first and second PMOS transistors may be included in the first and second page buffers, respectively, and may perform the same function. In an embodiment, a first channel length of the first PMOS transistor may be greater than a second channel length of the second PMOS transistor. In an embodiment, a first width of the first PMOS transistor may be greater than a second width of the second PMOS transistor. In an embodiment, the first channel length and the first width of the first PMOS transistor may be greater than the second channel length and the second width of the second PMOS transistor, respectively.

As described above, the first size of the first PMOS transistor included in the first page buffer which is relatively adjacent to the memory cell array region 210 is greater than the second size of the second PMOS transistor included in the second page buffer that is relatively far away from the memory cell array region 210. The smaller the size of the transistor, the smaller the threshold voltage, and the larger the size, the more the threshold voltage increases. Thus, the threshold voltage of the first PMOS transistor may be increased, thereby reducing the threshold voltage variation between the first and second PMOS transistors. As described above, according to the present embodiment, sizes of the first and second PMOS transistors may be differently determined, thereby compensating for a threshold voltage change between the first and second PMOS transistors.

Figure 11:
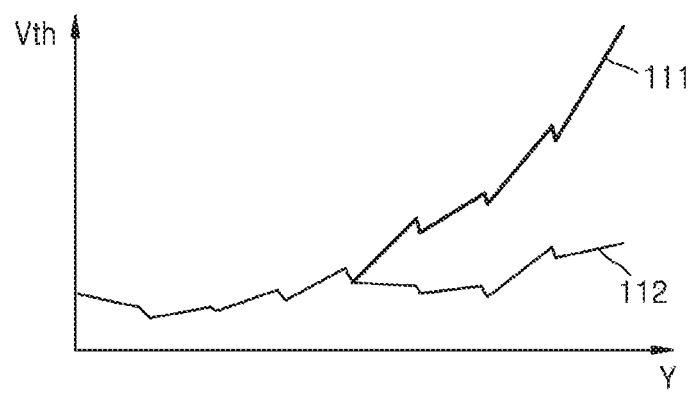
FIG. 11 illustrates a threshold voltage improvement of transistors with respect to locations of page buffers, according to an embodiment.

FIG. 11 illustrates a threshold voltage improvement of transistors with respect to locations of page buffers, according to an embodiment.

Referring to FIG. 11, a horizontal axis represents a location of a page buffer, that is, a transistor in a Y direction, and a vertical axis represents a threshold voltage of the transistor. A first case 111 represents a threshold voltage of a transistor with respect to the location of the page buffer when sizes of transistors (for example, TR2 in FIG. 4) performing the same function in each page buffer are the same. At this time, a difference between a threshold voltage of a transistor adjacent to a memory cell array region and a threshold voltage of a transistor spaced apart from the memory cell array region is relatively large.

A second case 112 represents a threshold voltage of the transistor with respect to the location of the page buffer when sizes of transistors (e.g., TR2 in FIG. 4) performing the same function in each page buffer are adjusted according to the present embodiment. At this time, the difference between the threshold voltage of the transistor adjacent to the memory cell array region and the threshold voltage of the transistor spaced apart from the memory cell array region is small compared to that of the first case 111. Thus, it may be seen that a threshold voltage change of the transistors with respect to the locations of the page buffers is compensated for.

Figure 12:
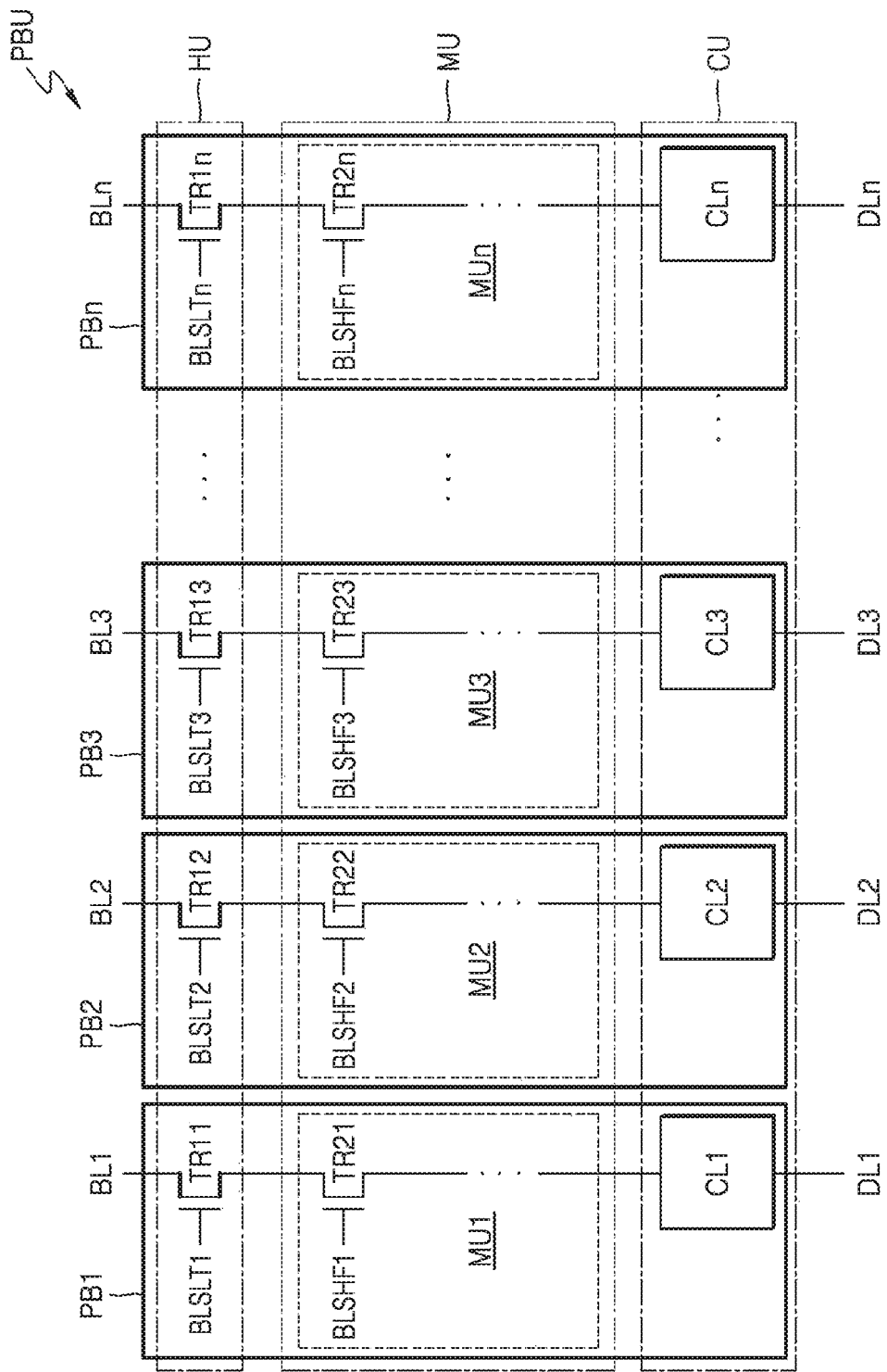
FIG. 12 is a circuit diagram showing in detail the page buffer unit, according to an embodiment.

FIG. 12 is a circuit diagram showing in detail the page buffer unit PBU, according to an embodiment.

Referring to FIG. 12, the page buffer unit PBU may correspond to an example of the page buffer unit 120 of FIG. 1 and may include the first through nth page buffers PB1 through PBn. In the present embodiment, a plurality of components included in the page buffer unit PBU may be identified as a high voltage unit HU, a main unit MU, and a cache unit CU according to locations in a page buffer region, i.e. according to a layout.

The high voltage unit HU may include high voltage transistors included in each of the first to nth page buffers PB1 to PBn, for example, first to nth bit line select transistors TR11 to TR1n. The first to nth bit line selection transistors may be controlled in accordance with the first to nth bit line selection signals BLSLT1 to BLSLTn, respectively. In an embodiment, voltage levels of the first through nth bit line select signals BLSLT1 through BLSLTn may be the same. However, the disclosure is not limited thereto. In some embodiments, the voltage levels of the first to nth bit line select signals BLSLT1 to BLSLTn may be different from each other. An individual bit line selection signal is referenced in FIG. 5 by BLSLT. The cache unit CU may include first to nth cache latches CL1 to CLn included in the first to nth page buffers PB1 to PBn, respectively. First to nth cache latches CL1 to CLn communicate data, DATA, externally, with respect to the page buffer unit PBA, through data lines DL1 to DLn.

The main unit MU may include first through nth main units MU1 through MUn included in the first through nth page buffers PB1 through PBn, respectively. For example, the first main unit MU1 may include other components in the first page buffer PB1 except for the first bit line select transistor TR11 and the first cache latch CL1. For example, each of the first to the nth main units MU1 to MUn may have a configuration substantially similar to that of the main unit MU of FIG. 5A.

The first to the nth main units MU1 to MUn may include at least first to nth bit line voltage control transistors TR21 to TR2n, respectively. The first to nth bit line voltage control transistors TR21 to TR2n may be respectively controlled according to the first to nth bit line voltage control signals BLSHF1 to BLSHFn. In an embodiment, voltage levels of the first to nth bit line voltage control signals BLSHF1 to BLSHFn may be the same. However, the disclosure is not limited thereto. In some embodiments, the voltage levels of the first to nth bit line voltage control signals BLSHF1 to BLSHFn may be different from each other.

Figure 13:
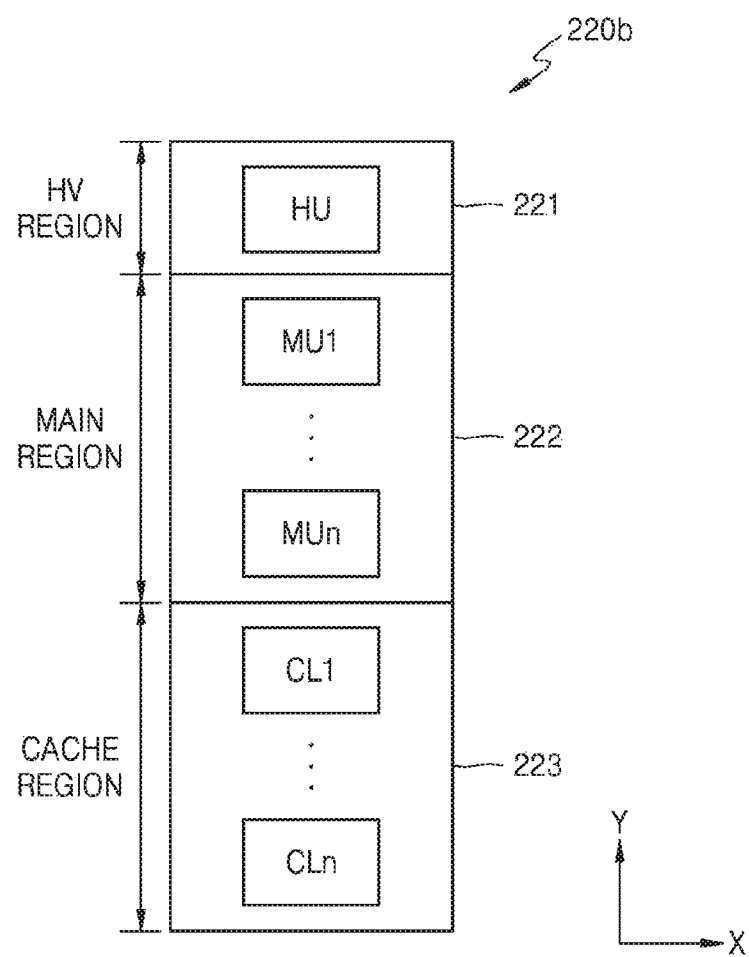
FIG. 13 is a layout of an example of a page buffer region, according to an embodiment.

FIG. 13 is a layout of an example of a page buffer region 220b, according to an embodiment. Referring to FIG. 13, the page buffer region 220b may include a high voltage region 221, a main region 222, and a cache region 223. For example, the high voltage region 221, the main region 222, and the cache region 223 may correspond to the high voltage unit HU, the main unit MU, and the cache unit CU, respectively, in FIG. 12.

Specifically, the high voltage unit HU may be arranged in the high voltage region 221, and the high voltage unit HU may include, for example, the first through nth bit line select transistors (TR11 through TR1n of FIG. 12). The first to nth main units MU1 to MUn may be arranged in a line in a first direction (e.g., a Y direction) in the main region 222. In the cache region 223, the first to nth cache latches CL1 to CLn may be arranged in a line along the first direction.

Figure 14A:
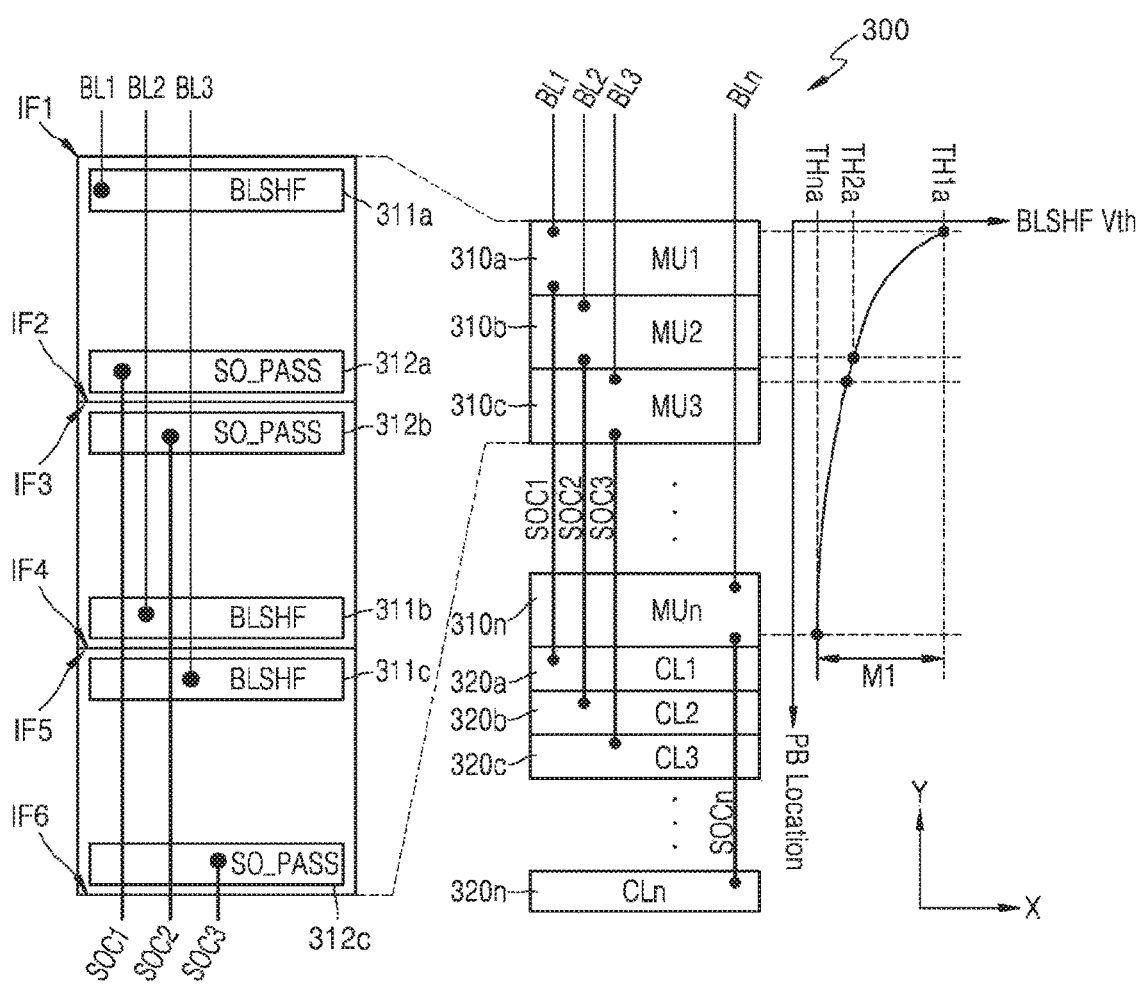
FIG. 14A shows a page buffer region according to a comparative example.
Figure 14B:
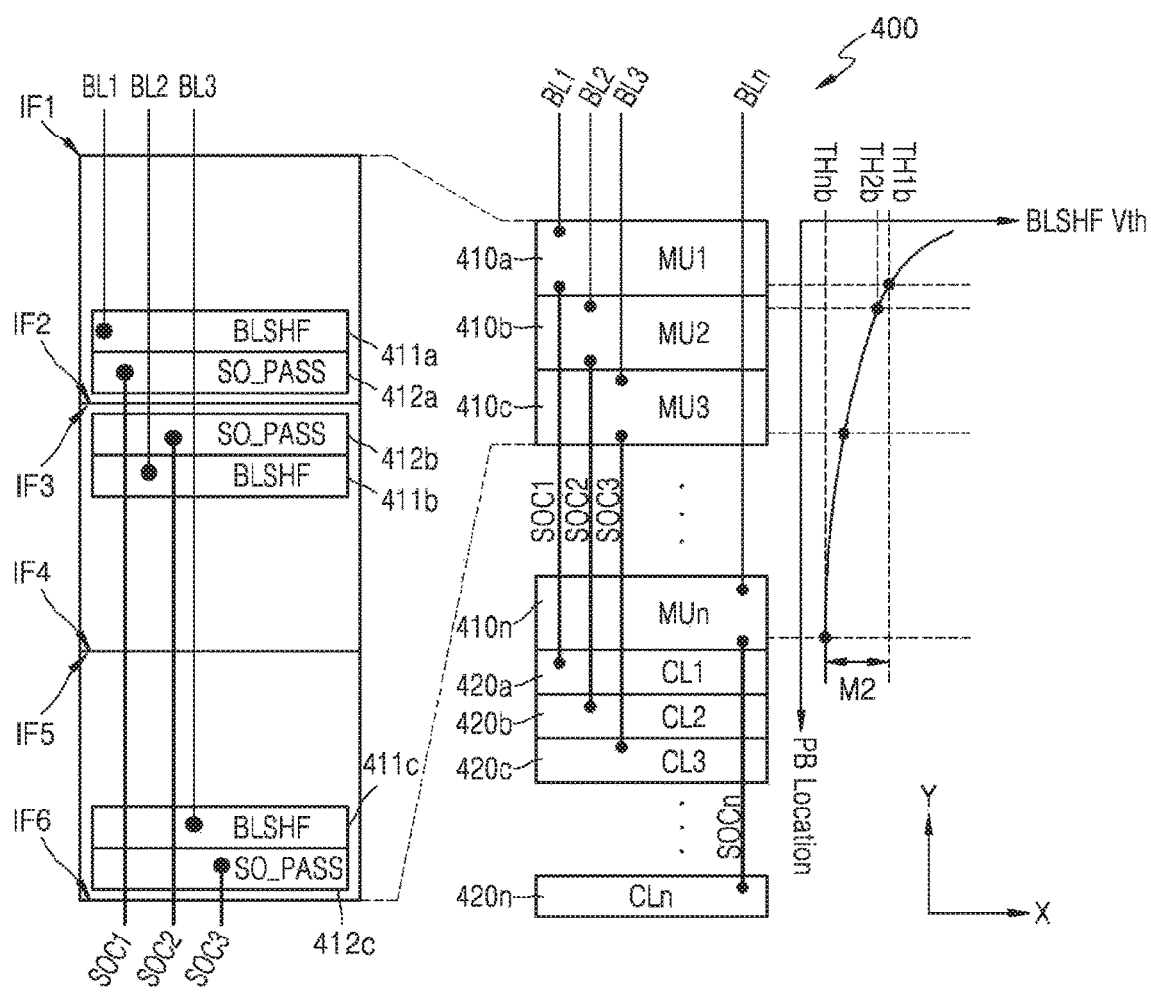
FIG. 14B shows a page buffer region according to an embodiment.

FIG. 14A shows a page buffer region 300 according to a comparative example, and FIG. 14B shows a page buffer region 400 according to an embodiment.

Referring to FIG. 14A, the page buffer region 300 may include first through nth main units 310a through 310n and first through nth cache latches 320a through 320n that are arranged in a line in a first direction. The first to third main units 310a to 310c may respectively include first transistors 311a to 311c connected to the first to third bit lines BL1 to BL3, respectively. The first to third main units 310a to 310c may further include second transistors 312a to 312c respectively connected to the first to third signal lines SOC1 to SOC3.

For example, the first transistors 311a through 311c may correspond to bit line voltage control transistors. Hereinafter, the first transistors 311a to 311c will be referred to as bit line voltage control transistors 311a to 311c. For example, the second transistors 312a to 312c may correspond to pass transistors. Hereinafter, the second transistors 312a to 312c will be referred to as pass transistors 312a to 312c. Each of pass transistors 312a to 312c may be controlled by a pass transistor control signal SO_PASS.

The first main unit 310a may include a first interface IF1 adjacent to the memory cell array region (e.g., 210 in FIG. 6) and a second interface IF2 opposite to the first interface IF1. The bit line voltage control transistor 311a is arranged adjacent to the first interface IF1. The pass transistor 312a is arranged adjacent to the second interface IF2. The second main unit 310b has a third interface IF3 adjacent to the first main unit 310a and a fourth interface IF4 opposite to the third interface IF3. The bit line voltage control transistor 311b may be arranged adjacent to the fourth interface IF4. The pass transistor 312b is arranged adjacent to the third interface IF3. As such, the first and second main units 310a and 310b may have a mirrored layout structure. The third main unit 310c has a fifth interface IF5 adjacent to the second main unit 310b and a sixth interface IF6 opposite to the fifth interface IF5. The bit line voltage control transistor 311c may be arranged adjacent to the fifth interface IF5. The pass transistor 312c is arranged adjacent to the sixth interface IF6. As such, the second and third main units 310b and 310c may have a mirrored layout structure.

In a nonvolatile memory device including a 3-dimensional (3D) memory cell array, threshold voltages of transistors included in each page buffer may be different from each other depending on a location of each page buffer (i.e., PB location) due to a mold stress. For example, a difference between the threshold voltage TH1a of the bit line voltage control transistor 311a included in the first main unit 310a and the threshold voltage THna of the bit line voltage control transistor included in the nth main unit 310n, that is, a mismatch M1 may be considerably large.

Referring to FIG. 14B, the page buffer region 400 may include first through nth main units 410a through 410n and first through nth cache latches 420a through 420n that are arranged in a line in a first direction. The first to third main units 410a to 410c may respectively include first transistors 411a to 411c connected to the first to third bit lines BL1 to BL3, respectively. The first to third main units 410a to 410c may respectively further include second transistors 412a to 412c connected to the first to third signal lines SOC1 to SOC3, respectively.

For example, the first transistors 411a through 411c may correspond to bit line voltage control transistors. Hereinafter, the first transistors 411a to 411c will be referred to as bit line voltage control transistors 411a to 411c. For example, the second transistors 412a through 412c may correspond to pass transistors. Hereinafter, the second transistors 412a to 412c will be referred to as pass transistors 412a to 412c. Each of pass transistors 412a to 412c may be controlled by a pass transistor control signal SO_PASS. However, the disclosure is not limited to bit line voltage control transistors and pass transistors.

The first main unit 410a may have the first interface IF1 adjacent to the memory cell array region (e.g., 210 in FIG. 6) and the second interface IF2 opposite to the first interface IF1. The bit line voltage control transistor 411a may be arranged closer to the second interface IF2 among the first and second interfaces IF1 and IF2. Accordingly, the bit line voltage control transistor 411a is located at a lower end than the bit line voltage control transistor 311a of FIG. 14A.

According to the present embodiment, a distance between the bit line voltage control transistor 411a and the memory cell array region in the first direction is larger than a distance between the bit line voltage control transistor 311a of FIG. 14A and the memory cell array region in the first direction. Thus, tensile stress on the bit line voltage control transistor 411a may decrease and the threshold voltage TH1b of the bit line voltage control transistor 411a may be lower than the threshold voltage TH1a of the bit line voltage control transistor 311a of FIG. 14A. Therefore, for example, a threshold voltage variation (i.e., TH1b-TH2b) between the bit line voltage control transistors 411a and 411b may be reduced relative to the threshold voltage variation (i.e., TH1a-TH2a) between the bit line voltage control transistors 311a and 311b.

The second main unit 410b may have the third interface IF3 adjacent to the first main unit 410a and the fourth interface IF4 opposite to the third interface IF3 and the bit line voltage control transistor 411b may be arranged closer to the third interface IF3 among the third and fourth interfaces IF3 and IF4. As a result, the bit line voltage control transistor 411b is located closer to the memory cell array region in the first direction than the bit line voltage control transistor 311b of FIG. 14A.

According to the present embodiment, a distance between the bit line voltage control transistor 411b and the memory cell array region in the first direction is smaller than a distance between the bit line voltage control transistor 311b of FIG. 14A and the memory cell array region in the first direction. Thus, tensile stress on the bit line voltage control transistor 411b may increase, and the threshold voltage TH2b of the bit line voltage control transistor 411b may be higher than the threshold voltage TH2a of the bit line voltage control transistor 311b of FIG. 14A. Therefore, for example, a threshold voltage variation (i.e., TH1b-TH2b) between the bit line voltage control transistors 411a and 411b may be reduced.

According to the present embodiment, locations of transistors, for example, the bit line voltage control transistors 411a to 411c having a large threshold voltage variation in the page buffer region 400 may be changed, and thus a threshold voltage variation of the bit line voltage control transistors 411a to 411c according to locations of page buffers may be compensated. A difference between the threshold voltage TH1b of the bit line voltage control transistor 411a included in the first main unit 410a and the threshold voltage THnb of the bit line voltage control transistor included in the nth main unit 410n, that is, a mismatch M2 may be greatly reduced as compared with the mismatch M1 in FIG. 14A.

In FIG. 14B, the page buffer region 400 includes the main units 410a to 410n and the cache latches 420a to 420n, but the disclosure is not limited thereto. In some embodiments, the main unit 410a and the cache latch 420a may be arranged adjacent to each other in the first direction. In this case, the bit line voltage control transistor 411a may be arranged away from the memory cell array region. As a result, the threshold voltage variation between the bit line voltage control transistors 411a and 411b may be reduced.

In FIGS. 14A and 14B, a case where the first transistors 311a and 411a are bit line voltage control transistors, for example, NMOS transistors, is described, but the disclosure is not limited thereto. In some embodiments, a transistor having a large threshold voltage variation according to a location of a page buffer may be the PMOS transistor (e.g., TR3 in FIG. 5A). At this time, the present embodiment described above with reference to FIG. 14B may also be applied to a PMOS transistor.

FIGS. 15A through 15D illustrate ion implantation masks used in a manufacturing process of a non-volatile memory device 500, according to embodiments.

Figure 15A:
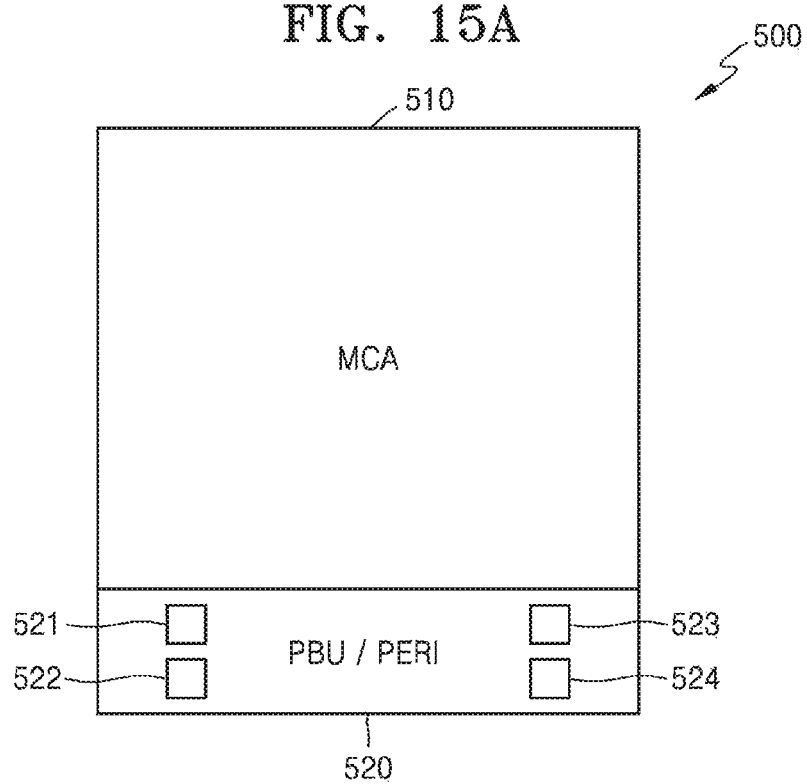
FIGS. 15A through 15D illustrate ion implantation masks used in a manufacturing process of a non-volatile memory device, according to embodiments.

Referring to FIG. 15A, the non-volatile memory device 500 may include a memory cell array region 510 and a page buffer/peripheral circuit region 520. In the memory cell array region 510, a plurality of memory cells may be vertically stacked on a substrate. For example, the memory cell array 110 of FIG. 1 may be arranged in the memory cell array region 510. The page buffer/peripheral circuit region 520 may be adjacent to the memory cell array region 510 in a first direction (e.g., a Y direction), and a plurality of page buffers and peripheral circuits may be arranged. For example, the page buffer unit 120, the control logic 140, and the voltage generator 150 of FIG. 1 may be arranged in the page buffer/peripheral circuit region 520.

A plurality of transistors may be arranged in the page buffer/peripheral circuit region 520. For example, the first and second NMOS transistors 521 and 522 and the first and second PMOS transistors 523 and 534 may be arranged in the page buffer/peripheral circuit region 520. The first NMOS transistor 521 and the first PMOS transistor 523 may be arranged adjacent to the memory cell array region 510 and the second NMOS transistor 522 and the second PMOS transistor 524 may be spaced apart from the memory cell array region 510.

Due to a mold stress occurring in a process of forming 3D memory cells in the memory cell array region 510, boron diffusion phenomena may differently occur in a plurality of transistors included in the page buffer/peripheral circuit region 520 according to a distance from the memory cell array region 510. Specifically, in the case of the first and second NMOS transistors 521 and 522, as the distance from the memory cell array region 510 increases, the boron diffusion phenomenon in a channel region may be intensified, and thus a threshold voltage may be reduced. Thus, a threshold voltage of the first NMOS transistor 521 may be higher than a threshold voltage of the second NMOS transistor 522. On the other hand, in the case of the first and second PMOS transistors 523 and 524, as the distance from the memory cell array region 510 increases, the boron diffusion phenomenon of a source/drain region may be intensified, and thus a threshold voltage increased. Thus, a threshold voltage of the first PMOS transistor 523 may be lower than a threshold voltage of the second PMOS transistor 524.

Figure 15B:
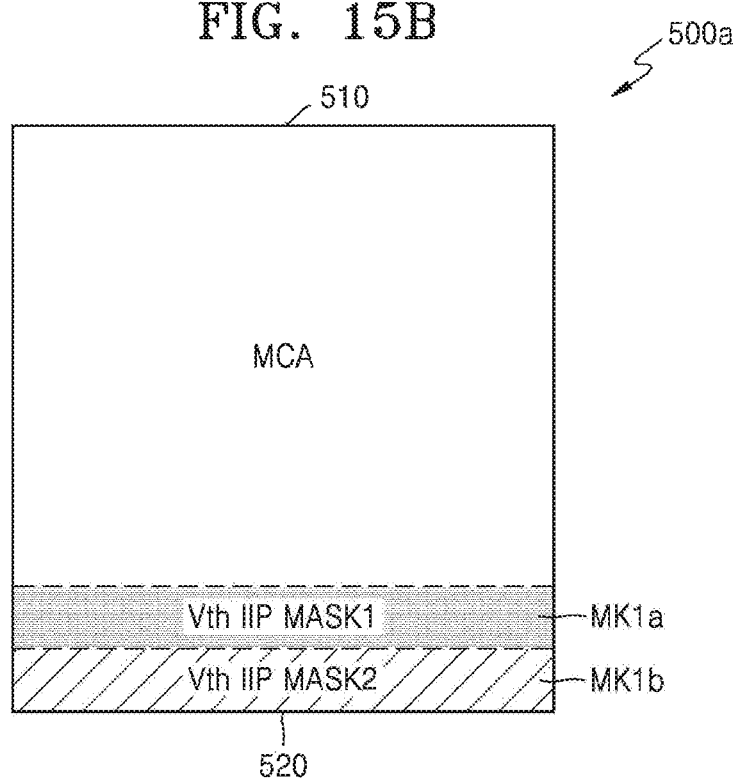

Referring to FIG. 15B, a non-volatile memory device 500a may include a memory cell array region 510 and a page buffer/peripheral circuit region 520. At least two first and second masks MK1a and MK1b may be used to perform an ion implantation process for forming a plurality of transistors in the page buffer/peripheral circuit region 520. For example, the first mask MK1a may be used to form transistors adjacent to the memory cell array region 510 and the second mask MK1b may be used to form transistors spaced apart from the memory cell array region 510. As described above, by applying at least the two first and second masks MK1a and MK1b according to the distance with the memory array region 510 in the page buffer peripheral circuit region 520, ion implant concentrations of a region to which the first mask MK1a is applied and a region to which the second mask MK1b is applied may be different from each other.

Figure 15C:
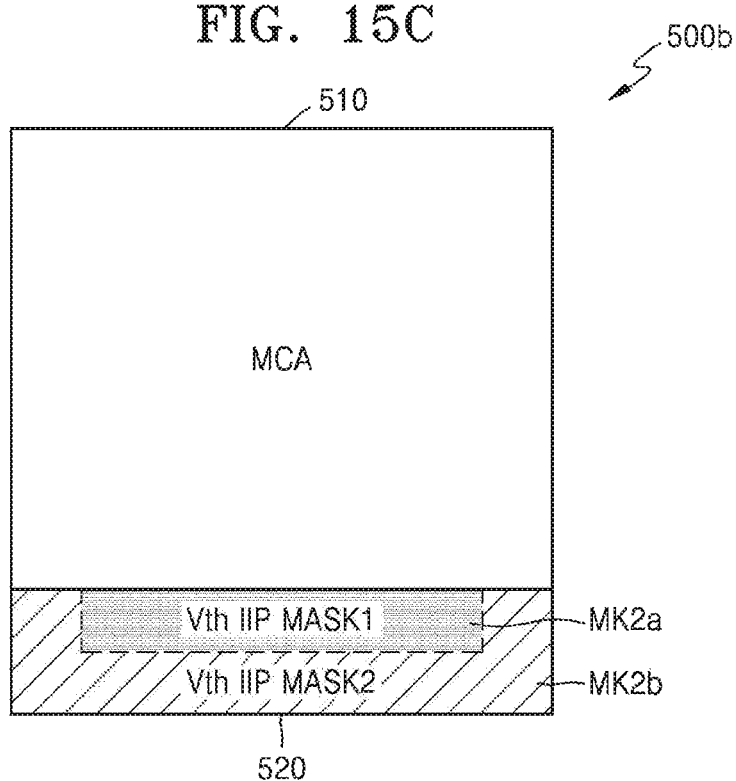

Referring to FIG. 15C, a non-volatile memory device 500b may include a memory cell array region 510 and a page buffer/peripheral circuit region 520. At least two first and second masks MK2a and MK2b may be used to perform an ion implantation process for forming a plurality of transistors in the page buffer/peripheral circuit region 520. For example, the first mask MK2a may be used to form transistors adjacent to the memory cell array region 510 in an inner region of the page buffer/peripheral circuit region 520, and the second mask MK2b may be used to form transistors adjacent to the memory cell array region 510 in an outer region of the buffer/peripheral circuit region 520 and transistors spaced apart from the memory cell array region 510. Accordingly, ion implant concentrations of a region to which the first mask MK2a is applied and a region to which the second mask MK2b is applied may be different from each other.

Figure 15D:
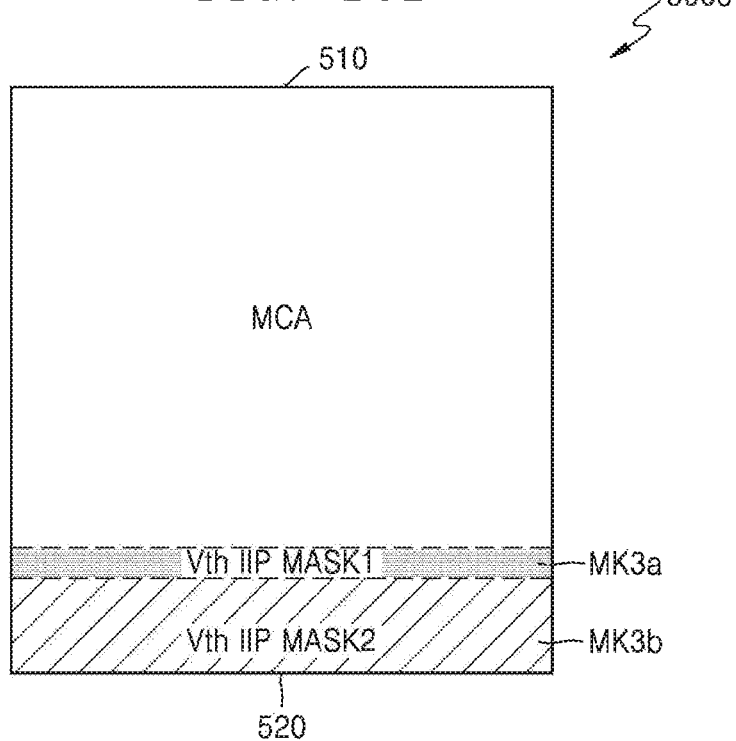

Referring to FIG. 15D, a non-volatile memory device 500c may include a memory cell array region 510 and a page buffer/peripheral circuit region 520. At least two first and second masks MK3a and MK3b may be used to perform an ion implantation process to form a plurality of transistors in the page buffer/peripheral circuit region 520. For example, the mask MK3a may be used to form transistors adjacent to the memory cell array region 510, and the mask MK3b may be used to form transistors spaced apart from the memory cell array region 510. In this case, the number of ion implants for a region to which the first mask MK3a is applied and the number of ion implants for a region to which the second mask MK3b is applied may be different, and thus ion implant concentrations in the region to which the first mask MK3a is applied and the region to which the second mask MK3b is applied may be different from each other.

Figure 16:
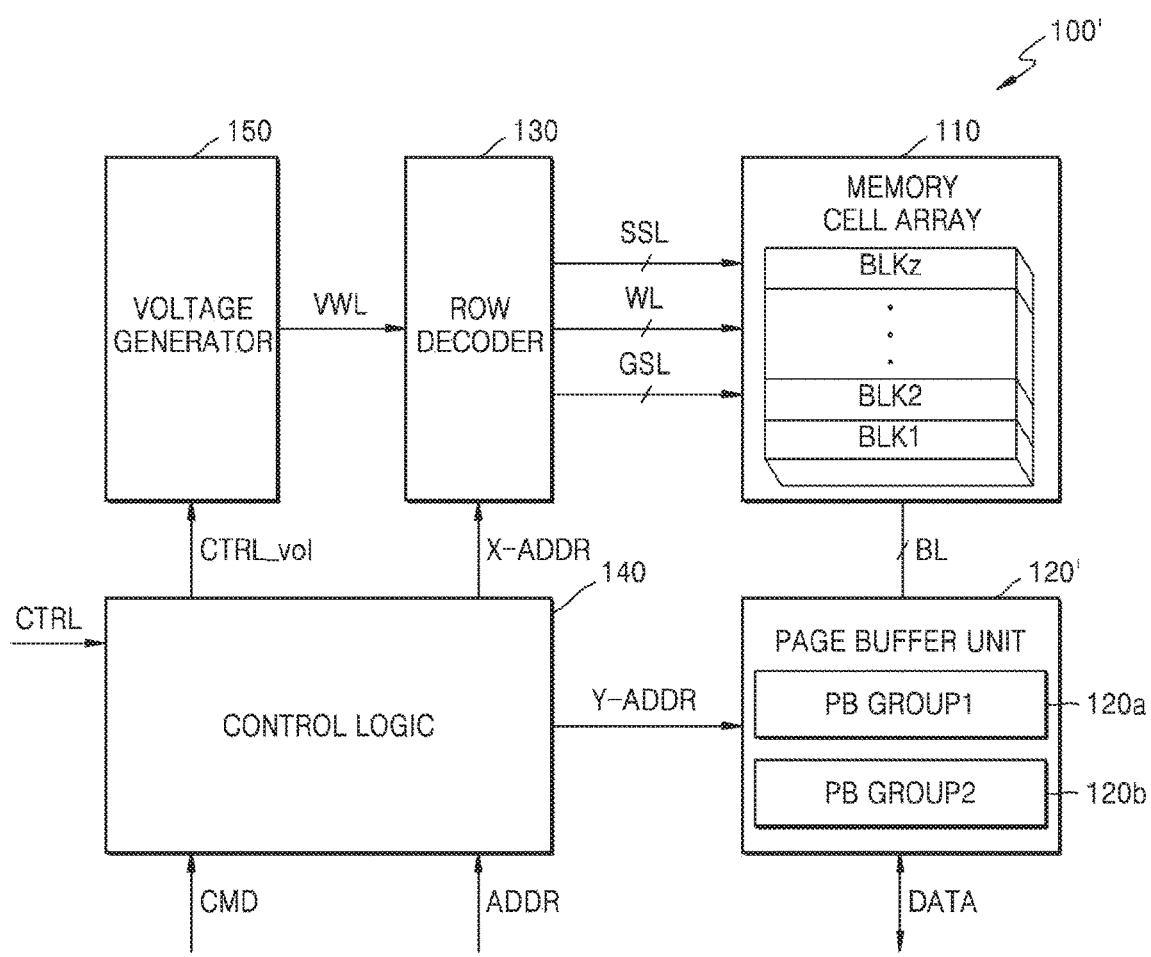
FIG. 16 is a block diagram illustrating a memory device according to an embodiment.

FIG. 16 is a block diagram illustrating a memory device 100' according to an embodiment.

Referring to FIG. 16, the non-volatile memory device 100' may include the memory cell array 110, a page buffer unit 120', the row decoder 130, the control logic 140, and the voltage generator 150. The non-volatile memory device 100' may correspond to a modification embodiment of the non-volatile memory device 100 of FIG. 1. The descriptions provided above with reference to FIGS. 1 to 15D may also be applied to the present embodiment, and redundant descriptions thereof will be omitted.

According to the present embodiment, the page buffer unit 120' may include at least two page buffer groups, for example, first and second page buffer groups 120a and 120b. For example, the page buffer unit 120' may include a plurality of page buffers (e.g., PB1_L to PB8_L of FIG. 8) that are adjacent in a first direction (e.g., the Y direction of FIG. 8). At this time, the first page buffer group 120a may include page buffers (e.g., PB1_L to PB4_L) relatively close to the memory cell array 110, and the second page buffer group 120b may include memory cells (e.g., PB5_L to PB8_L) that are relatively far away from the memory cell array 110.

In an embodiment, first transistors (e.g., bit line voltage control transistors) respectively included in page buffers included in the first page buffer group 120a and performing the same function have a first size, and second transistors respectively included in page buffers included in the second page buffer group 120b and performing the same function as the first transistors may have a second size different from the first size. For example, when the first and second transistors are NMOS transistors, the first size may be smaller than the second size. For example, when the first and second transistors are PMOS transistors, the first size may be greater than the second size.

In an embodiment, the first transistors (e.g., bit line voltage control transistors) respectively included in the page buffers included in the first page buffer group 120a and performing the same function may be arranged at a lower end relatively far from a memory cell array region in a region in which each page buffer is arranged. In addition, the second transistors respectively included in the page buffers included in the second page buffer group 120b and performing the same function as the first transistors may be arranged at an upper end relatively close to the memory cell array region in the region in which each page buffer is arranged.

In an embodiment, first transistors (e.g., bit line voltage control transistors) respectively included in odd-numbered page buffers among the page buffers included in the first page buffer group 120a and performing the same function may be arranged at a lower end relatively far from the memory cell array region in the region in which each page buffer is arranged and first transistors respectively included in even-numbered page buffers among the page buffers included in the first page buffer group 120a and performing the same function may be arranged at a upper end relatively close to the memory cell array region in the region in which each page buffer is arranged. In addition, second transistors respectively included in the page buffers included in the second page buffer group 120b and performing the same function as the first transistors may be arranged at an upper end relatively close to the memory cell array region in the region in which each page buffer is arranged.

As described above, according to the present embodiment, a plurality of page buffers included in the page buffer unit 120' may be divided into a plurality of page buffer groups according to their locations, and the same design constraint or the same process constraint may be applied and different design constraints or different process constraints may be applied to different page buffer groups.

Figure 17:
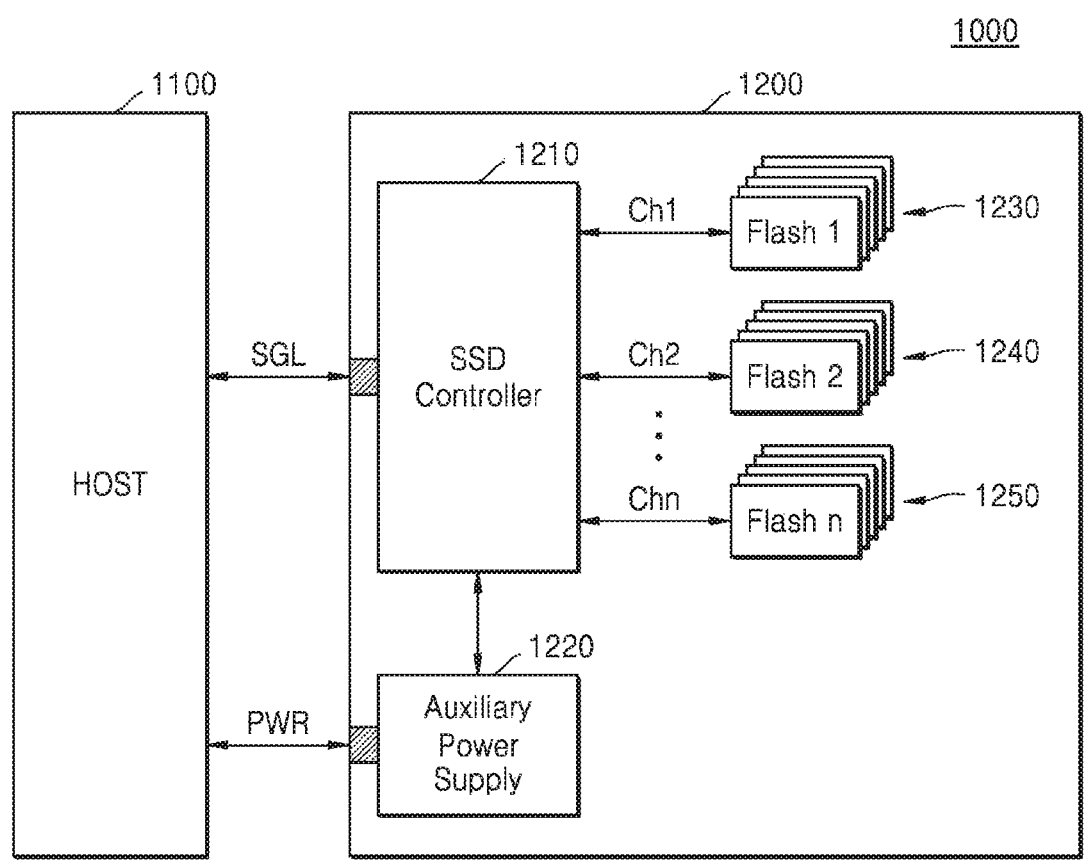
FIG. 17 is a block diagram illustrating an SSD system including a memory device according to an embodiment.

FIG. 17 is a block diagram illustrating an SSD system 1000 including a memory device according to an embodiment.

Referring to FIG. 17, the solid-state drive (SSD) system 1000 may include a host 1100 and an SSD 1200. The SSD 1200 exchanges signals SGL with the host 1100 through a signal connector and receives power PWR through a power connector. The SSD 1200 may include an SSD controller 1210, an auxiliary power supply 1220 and a plurality of memory devices 1230, 1240 and 1250. The plurality of memory devices 1230, 1240, 1250 may be vertical stack type NAND flash memory devices. The memory devices 1230 to 1250 may communicate with the SSD controller 1210 through respective channels Ch1 to Chn. At this time, at least one of the plurality of memory devices 1230, 1240, and 1250 may be embodied using the embodiments described above with reference to FIGS. 1 through 16.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A non-volatile memory device comprising:
a memory cell array region in which memory cells are vertically stacked on a substrate; and
a page buffer region in which first and second page buffers are arranged and a first distance between the memory cell array region and the first page buffer is shorter than a second distance between the memory cell array region and the second page buffer, wherein:

the first page buffer comprises a first transistor driven in response to a first control signal,
the second page buffer comprises a second transistor driven in response to a second control signal corresponding to the first control signal, and
at least one of design constraints and processing constraints with respect to the first and second transistors are different to reduce a threshold voltage difference existing between the first and second transistors, wherein:
the design constraints comprise at least one of a transistor size and a placement in a layout, and
the processing constraints comprise an implant concentration applied to ion implant processing for forming a transistor.

2. The non-volatile memory device of claim 1, wherein the first and second transistors respectively perform same functions in the first and second page buffers during read and write operations on the memory cells.

3. The non-volatile memory device of claim 1, wherein, in a period in which the first and second page buffers are activated, a voltage level of the first control signal is the same as a voltage level of the second control signal.

4. The non-volatile memory device of claim 1, wherein a first size of the first transistor is different from a second size of the second transistor.

5. The non-volatile memory device of claim 4, wherein:
the first transistor corresponds to a first n-channel metal-oxide-semiconductor (NMOS) transistor and the second transistor corresponds to a second NMOS transistor, and
a first length of the first NMOS transistor is smaller than a second length of the second NMOS transistor, or
a first width of the first NMOS transistor is smaller than a second width of the second NMOS transistor.

6. The non-volatile memory device of claim 4, wherein:
the first transistor corresponds to a first p-channel metal-oxide-semiconductor (PMOS) transistor and the second transistor corresponds to a second PMOS transistor, and
a first length of the first PMOS transistor is greater than a second length of the second PMOS transistor, or
a first width of the first PMOS transistor is greater than a second width of the second PMOS transistor.

7. The non-volatile memory device of claim 1, wherein the first and second control signals respectively correspond to first and second bit line voltage control signals for precharging first and second bit lines respectively connected to the first and second page buffers.

8. The non-volatile memory device of claim 7, wherein:
a first region in which the first page buffer is arranged comprises a first interface adjacent to the memory cell array region and a second interface opposite to the first interface, and
the first transistor is arranged closer to the second interface from among the first and second interfaces.

9. The non-volatile memory device of claim 8, wherein:
a second region in which the second page buffer is arranged comprises a third interface adjacent to the first page buffer and a fourth interface opposite to the third interface, and
the second transistor is arranged closer to the third interface from among the third and fourth interfaces.

10. The non-volatile memory device of claim 1, wherein a first implant concentration with respect to the first transistor is greater than a second implant concentration with respect to the second transistor.

11. A non-volatile memory device comprising:
a memory cell array region in which memory cells are vertically stacked on a substrate; and
a page buffer region in which first and second page buffers are arranged and a first distance between the memory cell array region and the first page buffer is shorter than a second distance between the memory cell array region and the second page buffer, wherein:
the first page buffer comprises a first transistor driven in response to a first control signal and having a first size,
the second page buffer comprises a second transistor driven in response to a second control signal corresponding to the first control signal and having a second size different from the first size,
when the first and second transistors correspond to NMOS transistors, a size of the first transistor is smaller than a size of the second transistor, and
when the first and second transistors correspond to PMOS transistors, the size of the first transistor is greater than the size of the second transistor.

12. The non-volatile memory device of claim 11, wherein the first transistor is arranged close to a second interface from among a first interface adjacent to the memory cell array region and the second interface opposite to the first interface in a first region in which the first page buffer is arranged.

13. The non-volatile memory device of claim 12, wherein the second transistor is arranged close to a third interface from among the third interface adjacent to the first page buffer and a fourth interface opposite to the third interface in a second region in which the second page buffer is arranged.

14. The non-volatile memory device of claim 13, wherein the first page buffer is arranged closest to the memory cell array region and the second page buffer is arranged secondly adjacent to the memory cell array region.

15. A manufacturing method for a non-volatile memory device, the manufacturing method comprising:
forming a memory cell array in which memory cells are vertically stacked on a substrate;
forming a first page buffer comprising a first transistor having a first tensile stress; and
forming a second page buffer comprising a second transistor having a second tensile stress, wherein:
a first value of a manufacturing constraint for forming the first transistor is different from a second value for the same manufacturing constraint for forming the second transistor,
the first and second values of the manufacturing constraint are selected to reduce a threshold voltage difference existing between the first and second transistors due to a difference in the first and second tensile stresses of the first and second transistors, and
the manufacturing constraint corresponds to at least one of a channel length of the first and second transistors, a channel width of the first and second transistors, and a concentration of ion implantation.

16. The manufacturing method of claim 15, further comprising:
forming a third page buffer comprising a third transistor having a third tensile stress; and
forming a fourth page buffer comprising a fourth transistor having a fourth tensile stress, wherein:
the first, second, and third page buffers are formed between the fourth page buffer and the memory cell array, the first and second page buffers are formed between the third page buffer and the memory cell array, and the first page buffer is formed between the second page buffer and the memory cell array, a third value of a manufacturing constraint for forming the third transistor is different from a fourth value for the same manufacturing constraint for forming the fourth transistor, the manufacturing constraint for forming each of the first, second, third, and fourth transistors is the same manufacturing constraint, the third and fourth values of the manufacturing constraint are selected to reduce a threshold voltage difference existing between the third and fourth transistors due to a difference in the third and fourth tensile stresses of the third and fourth transistors, and the manufacturing constraint for forming the third and fourth transistors is a distance from the memory cell array.

* * * * *